(12) United States Patent
Hashi et al.

(10) Patent No.: US 9,276,595 B2
(45) Date of Patent: Mar. 1, 2016

(54) QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventors: Yukihiro Hashi, Shiojiri (JP); Shoichi Nagamatsu, Shiohiri (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 14/512,680

(22) Filed: Oct. 13, 2014

(65) Prior Publication Data
US 2015/0102863 A1    Apr. 16, 2015

(30) Foreign Application Priority Data

Oct. 15, 2013 (JP) .................................. 2013-215070

(51) Int. Cl.
*H03L 7/26* (2006.01)
(52) U.S. Cl.
CPC ...................................... *H03L 7/26* (2013.01)
(58) Field of Classification Search
CPC ....................................................... H03L 7/26
USPC ......................................................... 331/94.1, 3
See application file for complete search history.

(56) References Cited

U.S. PATENT DOCUMENTS

| 8,067,990 B2 * | 11/2011 | Chindo et al. ............... 331/94.1 |
| 2009/0135629 A1 | 5/2009 | Mancebo del Castillo Pagola |
| 2012/0235754 A1 | 9/2012 | Chindo |

FOREIGN PATENT DOCUMENTS

| JP | 09-098086 | 4/1997 |
| JP | 2010-028794 A | 2/2010 |
| JP | 2011-199329 A | 10/2011 |
| JP | 2012-191138 A | 10/2012 |

* cited by examiner

*Primary Examiner* — Joseph Chang
(74) *Attorney, Agent, or Firm* — Harness, Dickey & Pierce, P.L.C.

(57) ABSTRACT

An atomic oscillator includes: a base; a unit portion including a gas cell, in which alkali metal atoms are filled, and a heater that heats the gas cell; and a wiring line that electrically connects the base and the unit portion to each other and includes a portion having a cross-sectional area of 60 μm² or more and 100 μm² or less.

10 Claims, 13 Drawing Sheets

QUANTUM INTERFERENCE DEVICE, ATOMIC OSCILLATOR, ELECTRONIC APPARATUS, AND MOVING OBJECT

BACKGROUND

1. Technical Field

The present invention relates to a quantum interference device, an atomic oscillator, an electronic apparatus, and a moving object.

2. Related Art

An atomic oscillator that oscillates based on the energy transition of atoms of alkali metal, such as rubidium and cesium, is known. In general, the operating principle of the atomic oscillator is largely divided into a method using a double resonance phenomenon caused by light and a microwave and a method using the quantum interference effect (Coherent Population Trapping: CPT) due to two types of light components having different wavelengths.

In the atomic oscillator of any method, in order to fill alkali metal in a gas cell together with buffer gas and keep the alkali metal in a gas state, it is necessary to heat the gas cell to a predetermined temperature using a heater.

As such an atomic oscillator, a structure in which a unit including a gas cell and a heater is mounted on a substrate through a support portion and the heater and the substrate are electrically connected to each other through wiring lines, such as lead wires, is known as disclosed in JP-A-2010-28794.

In the atomic oscillator disclosed in JP-A-2010-28794, however, the amount of heat escaping from the unit including the gas cell and the heater to the substrate by heat conduction through wiring lines is large. As a result, there has been a problem in that it is not possible to reduce the power consumption of the atomic oscillator.

SUMMARY

An advantage of some aspects of the invention is to provide a quantum interference device and an atomic oscillator capable of reducing power consumption and to provide an electronic apparatus and a moving object with excellent reliability including the quantum interference device or the atomic oscillator.

The invention can be implemented as the following forms or application examples.

APPLICATION EXAMPLE 1

This application example is directed to a quantum interference device including: a base portion; a unit portion including a gas cell, in which metal atoms are filled, and a temperature adjusting portion that adjusts a temperature of the gas cell; and a wiring line that electrically connects the base portion and the unit portion to each other and includes a portion having a cross-sectional area of 60 $\mu m^2$ or more and 100 $\mu m^2$ or less.

According to the quantum interference device of this application example, since the cross-sectional area of the wiring line is optimized, it is possible to suppress the escape of heat to the base portion by heat conduction through the wiring line from the gas cell or a heating portion while suppressing an increase in the electrical resistance value of the wiring line. As a result, it is possible to reduce the power consumption of the quantum interference device.

APPLICATION EXAMPLE 2

In the quantum interference device according to the application example described above, it is preferable that the wiring line is supported by an insulating film.

With this configuration, the wiring line can be stably provided.

APPLICATION EXAMPLE 3

In the quantum interference device according to the application example described above, it is preferable that the quantum interference device further includes a reflecting portion that is disposed on a surface of the film and has a reflectance with respect to an electromagnetic wave having a wavelength of 4 $\mu m$ that is 50% or more.

With this configuration, it is possible to suppress the radiation of heat from the film.

APPLICATION EXAMPLE 4

In the quantum interference device according to the application example described above, it is preferable that at least a part of the reflecting portion is disposed on the unit portion side of the film.

With this configuration, it is possible to efficiently suppress the radiation of heat from the film while suppressing heat conduction to the base portion by heat conduction through the reflecting portion from the unit portion.

APPLICATION EXAMPLE 5

In the quantum interference device according to the application example described above, it is preferable that the wiring line contains platinum.

Platinum or an alloy containing platinum has relatively low thermal conductivity as well as allowing a thin film to be easily formed. For this reason, it is possible to reduce the thermal conductivity of the wiring line. In addition, since platinum or the alloy containing platinum has excellent chemical stability, it is not necessary to coat the wiring line in order to prevent corrosion and the like. Therefore, the wiring line can be easily formed, and the cross-sectional area of the wiring line can be easily reduced. In addition, it is possible to prevent breakage due to bending of the wiring line.

APPLICATION EXAMPLE 6

In the quantum interference device according to the application example described above, it is preferable that the wiring line contains copper.

Copper or an alloy containing copper has relatively low thermal conductivity as well as allowing a thin film to be easily formed. For this reason, it is possible to reduce the thermal conductivity of the wiring line. In addition, it is possible to prevent breakage due to bending of the wiring line.

APPLICATION EXAMPLE 7

In the quantum interference device according to the application example described above, it is preferable that a cross-sectional shape of the wiring line is a rectangle and a length of the wiring line in a short side direction is within a range of 0.5 $\mu m$ or more and 5 $\mu m$ or less.

With this configuration, it is possible to easily form the wiring line having a small cross-sectional area. In addition, it is possible to prevent breakage due to bending of the wiring line.

APPLICATION EXAMPLE 8

In the quantum interference device according to the application example described above, it is preferable that the wiring line has a meandering wiring line.

With this configuration, the thermal resistance of the wiring line can be increased by increasing the heat transfer path of the wiring line. As a result, it is possible to effectively suppress the escape of heat to the base portion by heat conduction through the wiring line from the gas cell or the heating portion.

APPLICATION EXAMPLE 9

This application example is directed to an atomic oscillator including the quantum interference device according to the application example.

Therefore, it is possible to provide an atomic oscillator capable of reducing power consumption.

APPLICATION EXAMPLE 10

This application example is directed to an electronic apparatus including the quantum interference device according to the application example.

With this configuration, it is possible to provide an electronic apparatus having excellent reliability.

APPLICATION EXAMPLE 11

This application example is directed to a moving object including the quantum interference device according to the application example.

With this configuration, it is possible to provide a moving object having excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a quantum interference device, an atomic oscillator, an electronic apparatus, and a moving object of the invention will be described in detail with reference to the accompanying diagrams.

1. Atomic Oscillator (Quantum Interference Device)

First, an atomic oscillator according to the invention (a quantum interference device according to the invention) will be described. In addition, an example where the quantum interference device according to the invention is applied to an atomic oscillator will be described below. However, the quantum interference device according to the invention is not limited thereto, and can be applied to, for example, a magnetic sensor and a quantum memory as well as the atomic oscillator.

Figure 1:
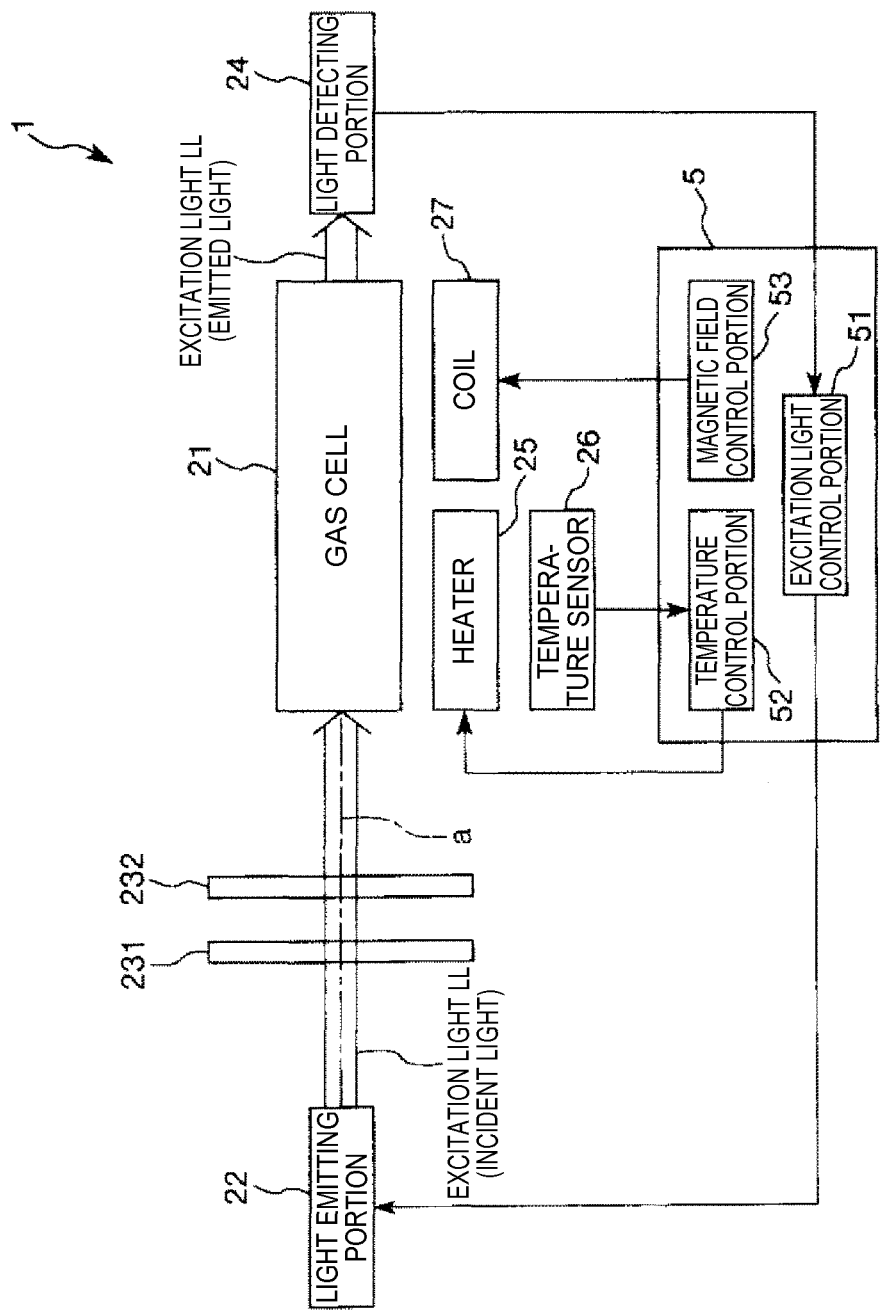
FIG. 1 is a schematic diagram showing an atomic oscillator (quantum interference device) according to an embodiment of the invention.
Figure 2:
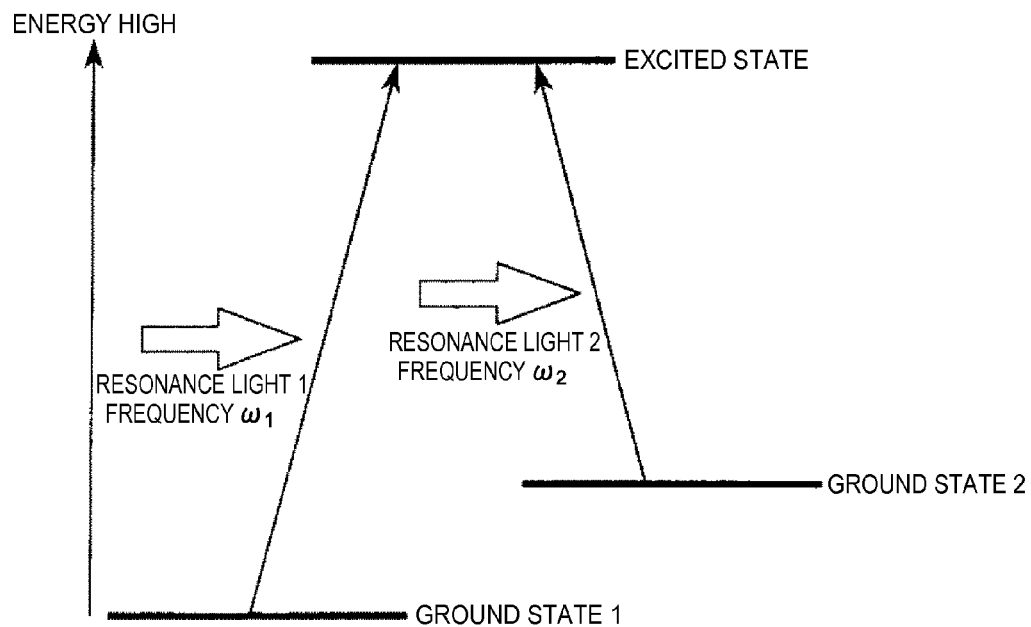
FIG. 2 is a diagram for explaining the energy state of alkali metal.
Figure 3:
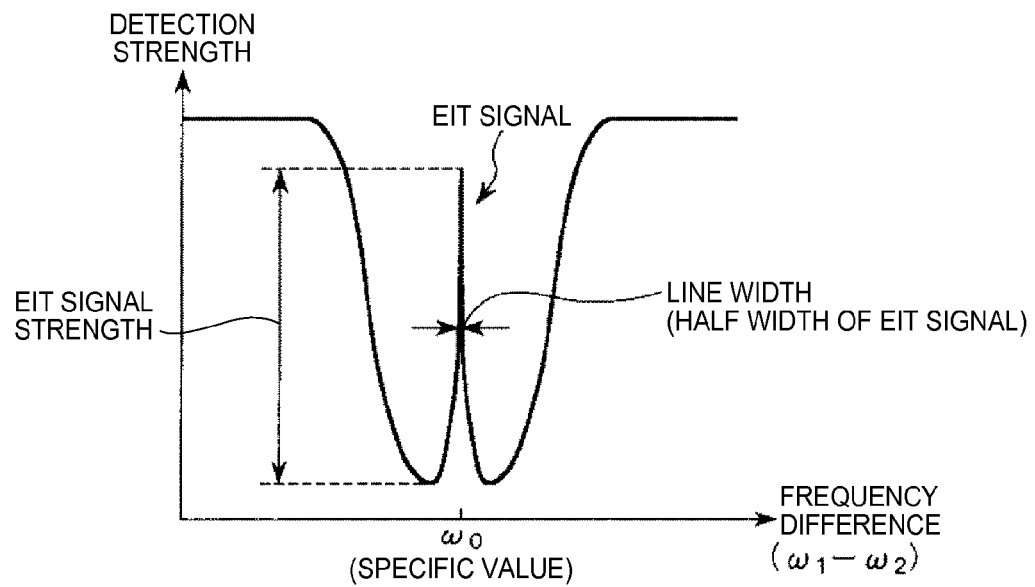
FIG. 3 is a graph showing the relationship between the frequency difference between two light components from a light emitting portion and the detection strength in a light detecting portion.

FIG. 1 is a schematic diagram showing an atomic oscillator (quantum interference device) according to the embodiment of the invention. FIG. 2 is a diagram for explaining the energy state of alkali metal, and FIG. 3 is a graph showing the relationship between the frequency difference between two light components from a light emitting portion and the detection strength in a light detecting portion.

An atomic oscillator 1 shown in FIG. 1 is an atomic oscillator using a quantum interference effect. As shown in FIG. 1, the atomic oscillator 1 includes a gas cell 21, a light emitting portion 22, optical components 231 and 232, a light detecting portion 24, a heater 25 (heating portion), a temperature sensor 26, a coil 27, and a control unit 5.

First, the principle of the atomic oscillator 1 will be described briefly.

As shown in FIG. 1, in the atomic oscillator 1, the light emitting portion 22 emits excitation light LL toward the gas cell 21, and the light detecting portion 24 detects the excitation light LL transmitted through the gas cell 21.

Alkali metal (metal atoms) in a gaseous state is filled in the gas cell 21. As shown in FIG. 2, the alkali metal has an energy level of three levels, and can take three states of two ground states (ground states 1 and 2) of different energy levels and an excited state. Here, the ground state 1 is an energy state lower than the ground state 2.

The excitation light LL emitted from the light emitting portion 22 includes two types of resonance light components 1 and 2 having different frequencies. When the two types of resonance light components 1 and 2 are emitted to the gaseous alkali metal described above, the light absorption rate (light transmittance) in the alkali metal of the resonance light components 1 and 2 changes depending on a difference $(\omega_1-\omega_2)$ between the frequency $\omega_1$ of the resonance light 1 and the frequency $\omega_2$ of the resonance light 2.

In addition, when the difference $(\omega_1-\omega_2)$ between the frequency $\omega_1$ of the resonance light 1 and the frequency $\omega_2$ of the resonance light 2 matches a frequency equivalent to the energy difference between the ground states 1 and 2, each excitation from the ground states 1 and 2 to the excited state is stopped. In this case, both the resonance light components 1 and 2 are transmitted through the alkali metal without being absorbed by the alkali metal. Such a phenomenon is called a CPT phenomenon or an electromagnetically induced transparency (EIT) phenomenon.

For example, as the light emitting portion 22 changes the frequency $\omega_2$ of the resonance light 2 in a state where the frequency $\omega_1$ of the resonance light 1 is fixed, when the difference $(\omega_1-\omega_2)$ between the frequency $\omega_1$ of the resonance light 1 and the frequency $\omega_2$ of the resonance light 2 matches a frequency $\omega_0$ equivalent to the energy difference between the ground states 1 and 2, the detection strength of the light detecting portion 24 rises steeply due to the above-described EIT phenomenon as shown in FIG. 3. Such a steep signal is detected as an EIT signal. The EIT signal has a unique value determined by the type of alkali metal. Accordingly, by using the EIT signal, it is possible to form an oscillator.

Hereinafter, the specific configuration of the atomic oscillator 1 of the present embodiment will be described.

Figure 4:
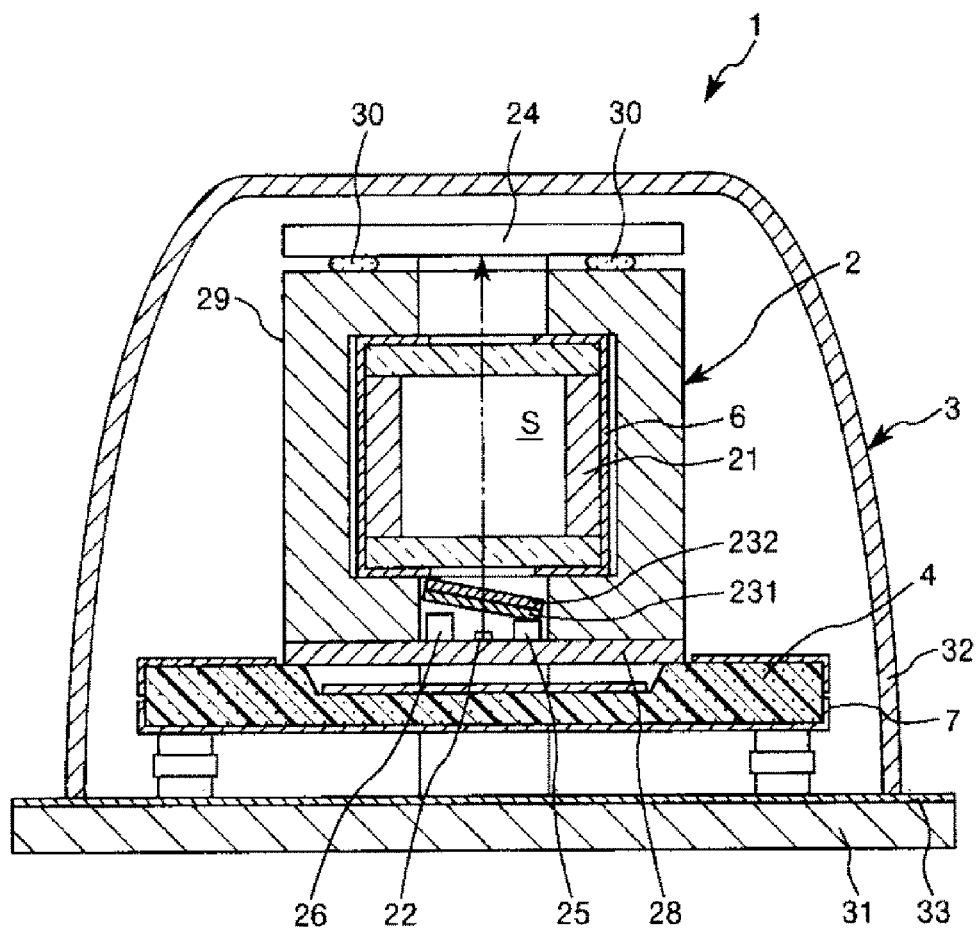
FIG. 4 is a cross-sectional view showing the structure of the atomic oscillator shown in FIG. 1.
Figure 5:
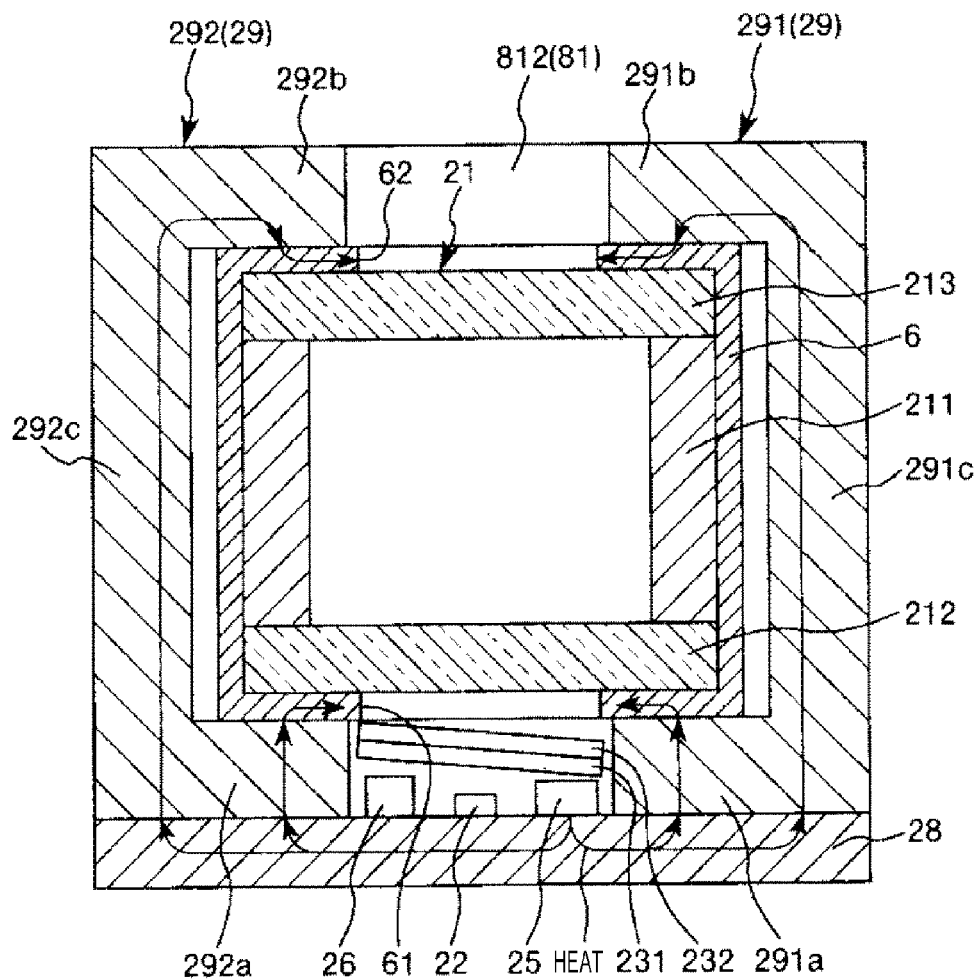
FIG. 5 is a cross-sectional view for explaining a heating portion and a connection member of a unit portion provided in the atomic oscillator shown in FIG. 4.
Figure 6:
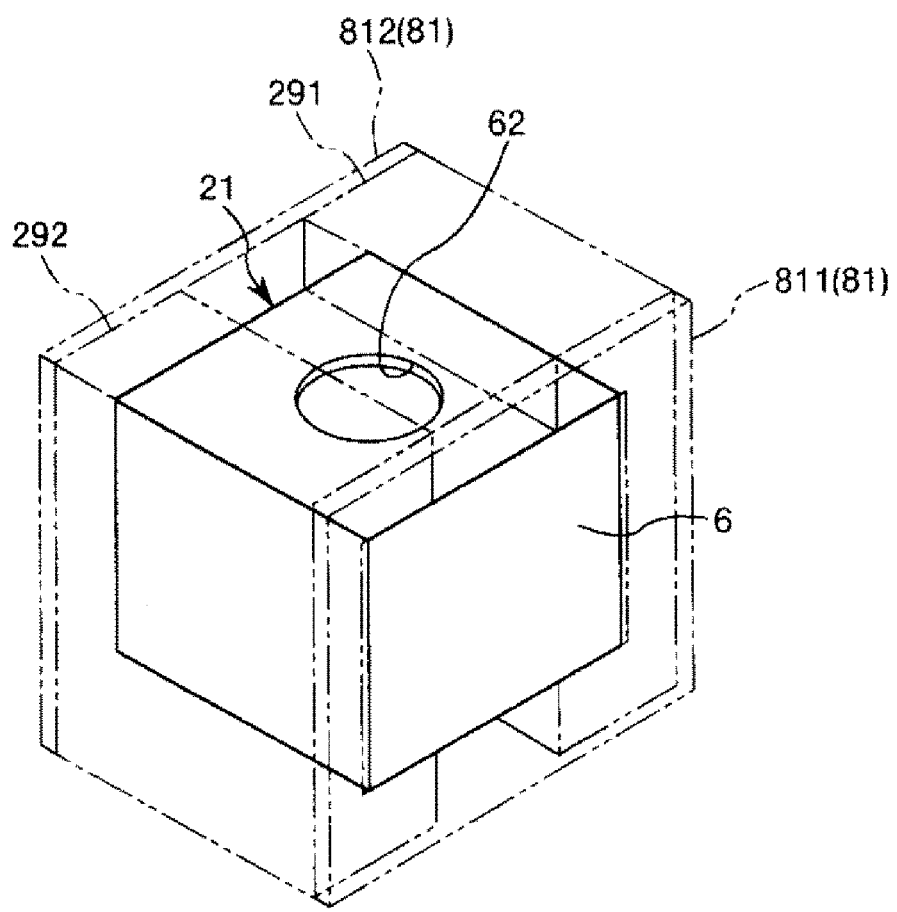
FIG. 6 is a diagram for explaining a gas cell and a heating side reflecting portion of a unit portion provided in the atomic oscillator shown in FIG. 4.

FIG. 4 is a cross-sectional view showing the structure of the atomic oscillator shown in FIG. 1. FIG. 5 is a cross-sectional view for explaining a heating portion and a connection member of a unit portion provided in the atomic oscillator shown in FIG. 4. FIG. 6 is a diagram for explaining a gas cell and a heating side reflecting portion of the unit portion provided in the atomic oscillator shown in FIG. 4.

Hereinafter, for convenience of explanation, an upper side and a lower side in FIG. 4 are referred to as "top" and "bottom", respectively.

As shown in FIG. 4, the atomic oscillator 1 includes a unit portion 2 that forms a main portion to cause the above-described quantum interference effect, a package 3 in which the unit portion 2 is housed, a support member 4 (support portion) that is housed in the package 3 and supports the unit portion 2 against the package 3, and a support side reflecting portion 7 provided on the outer surface of the support member 4.

Here, the unit portion 2 includes the gas cell 21, the light emitting portion 22, the optical components 231 and 232, the light detecting portion 24, the heater 25 (temperature adjusting portion), the temperature sensor 26, a substrate 28, a connection member 29, and heating side reflecting portions 6 and 81, and these are unitized.

Figure 8:
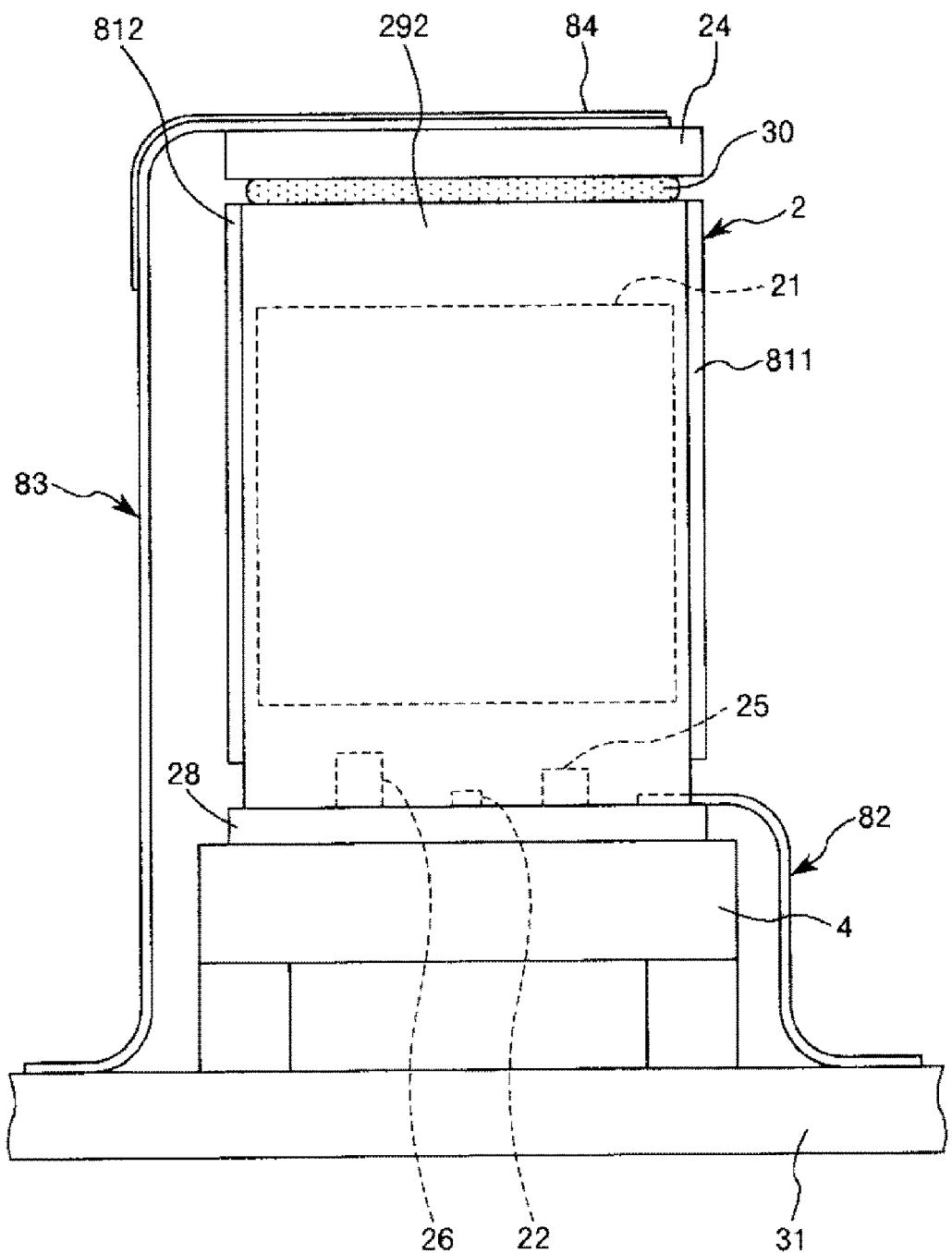
FIG. 8 is a side view for explaining wiring lines provided in the atomic oscillator shown in FIG. 4.

In addition, the atomic oscillator 1 includes wiring portions 82 and 83 for application of current to the unit portion 2 (refer to FIG. 8).

Hereinafter, each portion of the atomic oscillator 1 will be described in detail in a sequential manner.

Gas Cell

In the gas cell 21, gaseous alkali metal, such as rubidium, cesium, and sodium in a gaseous state, is filled. In the gas cell 21, rare gas, such as argon and neon, and inert gas, such as nitrogen, may be filled as buffer gas together with alkali metal gas when necessary.

As shown in FIG. 5, the gas cell 21 includes a body portion 211 having a columnar through hole and a pair of window portions 212 and 213 that block both openings of the through hole. In this manner, internal space S where the alkali metal described above is filled is formed.

Here, each of the window portions 212 and 213 of the gas cell 21 allows the excitation light from the light emitting portion 22 described above to be transmitted therethrough. In addition, excitation light incident on the gas cell 21 is transmitted through one window portion 212, and excitation light emitted from the gas cell 21 is transmitted through the other window portion 213.

A constituent material of the window portions 212 and 213 is not particularly limited as long as the material allows excitation light to be transmitted therethrough as described above. For example, a glass material, crystal, and the like can be used.

In addition, a constituent material of the body portion 211 of the gas cell 21 is not particularly limited. For example, a silicon material, a ceramic material, a metal material, a resin material, and the like may be used, or a glass material and crystal may be used similar to the window portions 212 and 213.

In addition, the window portions 212 and 213 are airtightly bonded to the body portion 211. Therefore, the internal space S of the gas cell 21 can be formed as an airtight space.

A method of bonding the body portion 211 and the window portions 212 and 213 of the gas cell 21 is determined depending on their constituent materials. Although the method is not particularly limited, for example, a bonding method using an adhesive, a direct bonding method, and an anodic bonding method can be used.

The gas cell 21 described above is heated by heat from the heater 25. Therefore, the temperature of the gas cell 21 can be adjusted to a desired temperature.

As shown in FIG. 5, the heating side reflecting portion 6 (low heat radiation portion) is disposed on the outer surface of the gas cell 21. The reflectance of the heating side reflecting portion 6 with respect to an electromagnetic wave (that is, far-infrared ray) having a wavelength of 4 μm is 50% or more. Therefore, it is possible to suppress the escape of heat of the gas cell 21 by radiation. In addition, it is also possible to suppress heat transfer due to radiation from the package 3 side to the gas cell 21 by reflecting the heat radiated from the package 3 side using the heating side reflecting portion 6.

The heating side reflecting portion 6 is disposed in a portion excluding a portion, through which the excitation light LL from the light emitting portion 22 is transmitted, of the outer surface of the gas cell 21. Therefore, regardless of the constituent material, thickness, and the like of the heating side reflecting portion 6, light from the light emitting portion 22 can be emitted to the alkali metal in the gas cell 21 and be detected by the light detecting portion 24. As a result, it is possible to effectively suppress the heat radiation from the heating side reflecting portion 6.

More specifically, in the heating side reflecting portion 6, openings 61 and 62 are formed in the passage area of the excitation light LL. The heating side reflecting portion 6 covers the outer surface of the gas cell 21 in the entire region other than the formation region of the openings 61 and 62.

The effect described above increases as the reflectance (hereinafter, also referred to as "reflectance of heat") of the heating side reflecting portion 6 with respect to an electromagnetic wave having a wavelength of 4 μm increases.

Accordingly, the reflectance of the heating side reflecting portion 6 is preferably 75% or more, more preferably 90% or more, and most preferably 95% or more.

A constituent material of the heating side reflecting portion 6 is not particularly limited as long as the reflectance of heat of the material is higher than that of the outer surface of the gas cell 21 (that is, as long as the emissivity of heat of the material is lower than that of the outer surface of the gas cell 21), and it is preferable to use a metal material. In this manner, it is possible to set the reflectance of heat of the heating side reflecting portion 6 to 75% or more.

A metal material that forms the heating side reflecting portion 6 is not particularly limited. For example, it is possible to use metals, such as copper (reflectance of heat of 97.93%), silver (reflectance of heat of 98.47%), gold (reflectance of heat of 98.62%), titanium (reflectance of heat of 78.04%), chromium (reflectance of heat of 93.77%), iron (reflectance of heat of 87.09%), cobalt (reflectance of heat of 87.75%), nickel (reflectance of heat of 92.38%), aluminum (reflectance of heat of 99.03%), iridium (reflectance of heat of 98.73%), and lead (reflectance of heat of 98.90%), or an alloy containing at least one of these metals. Among these materials, in terms of high reflectance of heat, it is preferable to use copper, silver, gold, chromium, nickel, aluminum, iridium, and lead. In addition, in terms of excellent chemical stability, gold is preferable.

The heating side reflecting portion 6 may be formed of one kind of metal or alloy, or may be formed by laminating two or more kinds of metals or alloys.

By forming the heating side reflecting portion 6 using a material having larger thermal conductivity than that of the material that forms the gas cell 21, heat from the connection member 29 can be efficiently diffused by heat conduction of the heating side reflecting portion 6. As a result, it is possible to make the temperature distribution inside the gas cell 21 uniform. In particular, since the heating side reflecting portion 6 connects the window portions 212 and 213 to each other, it is possible to reduce the temperature difference between the window portions 212 and 213. In addition, since the heating side reflecting portion 6 is provided on the entire circumference along the edge of each of the window portions 212 and 213, it is possible to make the temperature distribution of each of the window portions 212 and 213 uniform. Also from such a point of view, it is preferable to form the heating side reflecting portion 6 using a metal material.

The heating side reflecting portion 6 has a film shape, and the method of forming the heating side reflecting portion 6 is not particularly limited. For example, it is possible to use a vapor deposition method, such as deposition and sputtering.

In addition, the heating side reflecting portion 6 may be provided when necessary or omitted.

Light Emitting Portion

The light emitting portion 22 has a function of emitting the excitation light LL to excite alkali metal atoms in the gas cell 21.

More specifically, the light emitting portion 22 emits two types of light components (resonance light 1 and resonance light 2), which have different frequencies as described above, as excitation light.

The frequency $\omega_1$ of the resonance light 1 is for exciting the alkali metal in the gas cell 21 from the ground state 1 to the excited state (resonance).

In addition, the frequency $\omega_2$ of the resonance light 2 is for exciting the alkali metal in the gas cell 21 from the ground state 2 to the excited state (resonance).

As the light emitting portion 22, there is no particular limitation as long as the excitation light can be emitted as described above. For example, a semiconductor laser, such as a vertical cavity surface emitting laser (VCSEL), can be used.

Optical Component

As shown in FIG. 4, each of the plurality of optical components 231 and 232 is provided on the optical path of excitation light between the light emitting portion 22 and the gas cell 21.

In the present embodiment, the optical components 231 and 232 are disposed in this order from the light emitting portion 22 side to the gas cell 21 side.

The optical component 231 is a λ/4 wave plate. Accordingly, the excitation light LL from the light emitting portion 22 can be converted from linearly polarized light to circularly polarized light (right-handed circularly polarized light or left-handed circularly polarized light).

As will be described later, if excitation light of linearly polarized light is emitted to alkali metal atoms in a state where the alkali metal atoms in the gas cell 21 are Zeeman splitting due to the magnetic field of the coil 27, the alkali metal atoms are present so as to be evenly dispersed in a plurality of Zeeman-split levels by interaction between the excitation light and the alkali metal atom. For this reason, since the number of alkali metal atoms in a desired energy level is reduced relative to the number of alkali metal atoms in the other energy levels, the number of atoms required to cause a desired EIT phenomenon is reduced, and the strength of a desired EIT signal is reduced. As a result, the oscillation characteristics of the atomic oscillator 1 are degraded.

In contrast, as will be described later, if excitation light of circularly polarized light is emitted to alkali metal atoms in a state where the alkali metal atoms in the gas cell 21 are Zeeman splitting due to the magnetic field of the coil 27, the number of alkali metal atoms in a desired energy level of a plurality of levels of the alkali metal atoms Zeeman splitting can be increased relative to the number of alkali metal atoms in the other energy levels by interaction between the excitation light and the alkali metal atom. For this reason, the number of atoms required to cause a desired EIT phenomenon is increased, and the strength of a desired EIT signal is increased. As a result, the oscillation characteristics of the atomic oscillator 1 can be improved.

The optical component 232 is a dimming filter (ND filter). Therefore, the intensity of the excitation light LL incident on the gas cell 21 can be adjusted (reduced). For this reason, even if the output of the light emitting portion 22 is large, the amount of excitation light incident on the gas cell 21 can be set to a desired amount of light. In the present embodiment, the intensity of the excitation light LL having polarized light in a predetermined direction, which has passed through the optical component 231, is adjusted by the optical component 232.

Between the light emitting portion 22 and the gas cell 21, not only the wave plate and the dimming filter but also other optical components, such as a lens and a polarizing plate, may be disposed. In addition, depending on the intensity of excitation light from the light emitting portion 22, the optical component 232 may be omitted.

Light Detecting Portion

The light detecting portion 24 has a function of detecting the intensity of the excitation light LL (resonance light components 1 and 2) transmitted through the gas cell 21.

In the present embodiment, the light detecting portion 24 is bonded to the connection member 29 with an adhesive 30 interposed therebetween.

As the adhesive 30, a known adhesive can be used. However, by using an adhesive with excellent thermal conductivity, it is also possible to adjust the temperature of the light detecting portion 24 by the heat from the connection member 29.

As the light detecting portion 24, there is no particular limitation as long as the excitation light LL can be detected as described above. For example, an optical detector (light receiving element), such as a solar battery and a photodiode, can be used.

The light detecting portion 24 described above is electrically connected to a base 31 (base portion) of the package 3, which will be described later, through the wiring portion 83.

Heater

The heater 25 has a heating resistor (heating portion) that generates heat by current application. The heater 25 forms a "temperature adjusting portion" that adjusts the temperature of the gas cell 21.

Heat from the heater 25 is transferred to the gas cell 21 through the substrate 28 and the connection member 29. As a result, the gas cell 21 (more specifically, alkali metal in the gas cell 21) is heated, and the alkali metal in the gas cell 21 can be maintained in a gas state of a desired concentration. In the present embodiment, heat from the heater 25 is also transferred to the light emitting portion 22 through the substrate 28.

The heater 25 is spaced apart from the gas cell 21. Therefore, it is possible to suppress a situation where an unnecessary magnetic field caused by the application of current to the heater 25 has an adverse effect on metal atoms in the gas cell 21.

In the present embodiment, the heater 25 is provided on the substrate 28. In this case, heat from the heater 25 is transferred to the substrate 28. In addition, the heater 25 is electrically connected to wiring lines (not shown) provided on the substrate 28.

Temperature Sensor

The temperature sensor 26 detects the temperature of the heater 25 or the gas cell 21. Based on the detection result of the temperature sensor 26, the amount of heat generated by the heater 25 described above is controlled. In this manner, it is possible to maintain alkali metal atoms in the gas cell 21 at a desired temperature.

In the present embodiment, the temperature sensor 26 is provided on the substrate 28. The temperature sensor is electrically connected to wiring lines (not shown) provided on the substrate 28.

The installation position of the temperature sensor 26 is not limited to the above. For example, the temperature sensor 26 may be provided on the connection member 29, or may be provided on the heater 25, or may be provided on the outer surface of the gas cell 21. As the temperature sensor 26, various known temperature sensors, such as a thermistor and a thermocouple, can be used without being particularly limited.

Coil

The coil 27 has a function of generating a magnetic field by current application. Therefore, by applying a magnetic field to the alkali metal in the gas cell 21, a gap between the degenerate different energy levels of the alkali metal is spread by Zeeman splitting, thereby being able to improve the resolution. As a result, it is possible to improve the accuracy of the oscillation frequency of the atomic oscillator 1.

In addition, the magnetic field generated by the coil 27 may be either a DC magnetic field or an AC magnetic field, or may be a magnetic field in which the DC magnetic field and the AC magnetic field are superimposed.

In addition, the coil 27 may be a solenoid coil provided so as to surround the gas cell 21, or may be a Helmholtz coil provided so as to interpose the gas cell 21.

Although the installation position of the coil 27 is not shown in the diagram, the coil 27 may be provided between the gas cell 21 and the connection member 29, or may be provided between the connection member 29 and the package 3, or may be provided on the outer side of the package 3. The coil 27 is electrically connected to the control unit 5 through a wiring line (not shown). The wiring line connected to the coil 27 may be electrically connected to the base 31 through a wiring line provided on the substrate 28, or may be directly connected to the base 31.

Connection Member

The connection member 29 thermally connects the heater 25 and each of the window portions 212 and 213 of the gas cell 21. Therefore, since heat from the heater 25 is transferred to the window portions 212 and 213 by thermal conduction of the connection member 29, each of the window portions 212 and 213 can be heated. In addition, the heater 25 and the gas cell 21 can be spaced apart from each other. In this case, it is possible to suppress a situation where an unnecessary magnetic field caused by the application of current to the heater 25 has an adverse effect on the alkali metal atoms in the gas cell 21. In addition, since the number of heaters 25 can be reduced, for example, the number of wiring lines for the application of current to the heater 25 can be reduced. As a result, it is possible to miniaturize the atomic oscillator 1 (quantum interference device).

As shown in FIG. 5, the connection member 29 is formed by a pair of connection members 291 and 292 provided with the gas cell 21 interposed therebetween. Therefore, heat can be uniformly transferred from the connection member 29 to each of the window portions 212 and 213 of the gas cell 21 while simplifying the installation of the connection member 29 with respect to the gas cell 21.

More specifically, the connection member 291 includes a pair of connection portions 291a and 291b, which are disposed with the gas cell 21 interposed therebetween, and a connecting portion 291c that connects the pair of connection portions 291a and 291b to each other. Similarly, the connection member 292 includes a pair of connection portions 292a and 292b, which are disposed with the gas cell 21 interposed therebetween, and a connecting portion 292c that connects the pair of connection portions 292a and 292b to each other. Therefore, heat from the heater 25 can be efficiently transferred to each of the window portions 212 and 213.

Here, each of the connection members 291a, 292a, 291b, and 292b is in contact with the heating side reflecting portion 6. That is, the window portions 212 and 213 and the connection members 291 and 292 are connected to each other through the heating side reflecting portion 6.

In addition, each of the connection portions 291a, 291b, 292a, and 292b is formed so as to avoid the passage area of the excitation light LL. That is, each of the connection portions 291a, 291b, 292a, and 292b is disposed outside the passage area of the excitation light LL. Therefore, it is possible to make excitation light incident on the gas cell 21 while emitting the excitation light from the gas cell 21.

Such a pair of connection members 291 and 292 are fitted so as to interpose the gas cell 21 from both sides of a pair of side surfaces facing each other of the gas cell 21, for example.

When a gap is formed at least either between the heating side reflecting portion 6 and the connection portions 291a and 292a or between the heating side reflecting portion 6 and the connection portions 291b and 292b, an adhesive with thermal conductivity may be filled in the gap. As examples of the adhesive, metal paste, a resin-based adhesive containing a thermally conductive filler, and a silicone resin based adhesive can be mentioned.

In addition, the connecting portions 291c and 292c are disposed so as to form a gap between each of the connecting portions 291c and 292c and the heating side reflecting portion 6 (gas cell 21 when the heating side reflecting portion 6 is omitted). In this case, since the transfer of heat between each of the connecting portions 291c and 292c and the gas cell 21 can be suppressed, heat can be efficiently transferred from the connection members 291 and 292 to the window portions 212 and 213.

As a constituent material of the connection member 29, a material having larger thermal conductivity than that of a material that forms the gas cell 21 may be used. For example, it is preferable to use a material with excellent thermal conductivity, for example, a metal material.

The connection member 29 described above is mounted on the top surface of the substrate 28.

The heating side reflecting portion 81 (low heat radiation portion) is bonded to the connection member 29.

The reflectance of the heating side reflecting portion 81 with respect to an electromagnetic wave (that is, far-infrared ray) having a wavelength of 4 μm is 50% or more. Therefore, it is possible to suppress the escape of heat of the gas cell 21 by radiation. In addition, it is also possible to suppress heat transfer due to radiation from the package 3 side to the gas cell 21 by reflecting the heat radiated from the package 3 side using the heating side reflecting portion 81.

The heating side reflecting portion 81 is formed by a pair of plate-shaped or sheet-like reflecting members 811 and 812.

The reflecting members 811 and 812 are provided with the pair of connection members 291 and 292 interposed therebetween so as to cover the side surface of the gas cell 21 exposed from the pair of connection members 291 and 292 described above. In addition, the reflecting members 811 and 812 are bonded to the connection members 291 and 292 by an adhesive or the like.

Similar to the heating side reflecting portion 6, the effect described above increases as the reflectance of heat of the reflecting members 811 and 812 increases. Accordingly, the reflectance of heat of the reflecting members 811 and 812 is preferably 75% or more, more preferably 90% or more, and most preferably 95% or more.

As a constituent material of the reflecting members 811 and 812, the same material as the heating side reflecting portion 6 described above can be used.

In addition, the heating side reflecting portion 81 may be provided when necessary or omitted.

Substrate

The light emitting portion 22, the heater 25, the temperature sensor 26, and the connection member 29 are mounted on one surface (top surface) of the substrate 28.

The substrate 28 has a function of transferring the heat from the heater 25 to the connection member 29. Accordingly, even if the heater 25 is spaced apart from the connection member 29, the heat from the heater 25 can be transferred to the connection member 29.

Here, the substrate 28 thermally connects the heater 25 and the connection member 29 to each other. Thus, by mounting the heater 25 and the connection member 29 on the substrate 28, it is possible to increase the degree of freedom of the installation of the heater 25.

In addition, since the light emitting portion 22 is mounted on the substrate 28, it is possible to adjust the temperature of the light emitting portion 22 by the heat from the heater 25.

The substrate 28 also has a function of supporting the light emitting portion 22, the heater 25, the temperature sensor 26, and the connection member 29.

The substrate 28 has wiring lines (not shown) electrically connected to the light emitting portion 22, the heater 25, and the temperature sensor 26.

A constituent material of the substrate 28 is not particularly limited, and a material with excellent thermal conductivity, for example, a metal material can be used. By forming the substrate 28 using a metal material, it is also possible to increase the reflectance of heat of the surface of the substrate 28 and to suppress the radiation of heat from the substrate 28. When the substrate 28 is formed of a metal material, an insulating layer formed of, for example, a resin material, a metal oxide, or a metal nitride may be provided on the surface of the substrate 28, when necessary, in order to prevent short-circuiting of wiring lines provided on the substrate 28, or the like. However, in order to suppress the radiation of heat as described above, it is preferable that such an insulating layer not be provided on the bottom surface of the substrate 28 if possible. In the substrate 28, metal wiring lines may be provided on a ceramic substrate. If the top and bottom surfaces and the side surface are formed of a material with low emissivity, there is an effect of reducing the escape of heat by radiation.

The substrate 28 that has been described above is electrically connected to the base 31 of the package 3, which will be described later, through the wiring portion 82. Accordingly, each of the light emitting portion 22, the heater 25, and the temperature sensor 26 is electrically connected to the base 31 through the wiring portion 82.

The substrate 28 can be omitted depending on the shape of the connection member 29, the installation position of the heater 25, and the like. In this case, the heater 25 may be provided at a position where the heater 25 is brought into contact with the connection member 29. In this case, each of the light emitting portion 22, the heater 25, and the temperature sensor 26 may be directly connected to the wiring portion 82.

Package

As shown in FIG. 4, the package 3 has a function of housing the unit portion 2 and the support member 4 therein. Although not shown in FIG. 4, the coil 27 shown in FIG. 1 is also housed in the package 3. In addition, components other than the components described above may be housed in the package 3.

As shown in FIG. 4, the package 3 includes the plate-shaped base 31 (base portion) and a bottomed cylindrical lid 32, and the opening of the lid 32 is blocked by the base 31. Thus, a space where the unit portion 2 and the support member 4 are housed is formed.

The base 31 supports the unit portion 2 through the support member 4.

The base 31 is a wiring substrate. Although not shown, a plurality of wiring lines and a plurality of terminals for the application of current from the outside of the package 3 to the internal unit portion 2 are provided in the base 31.

A constituent material of the base 31 is not particularly limited. For example, it is possible to use a metal material, a resin material, and a ceramic material, and it is preferable to use a ceramic material. In this case, since the thermal insulation of the base 31 is increased, it is possible to further reduce the power consumption of the atomic oscillator 1.

In the present embodiment, as shown in FIG. 4, a base side reflecting portion 33 (low heat radiation portion) is disposed on the top surface of the base 31. The reflectance of the base side reflecting portion 33 with respect to an electromagnetic wave (that is, far-infrared ray) having a wavelength of 4 μm is 50% or more. Therefore, it is possible to suppress the escape of heat of the support member 4 by radiation. In addition, it is also possible to suppress heat transfer due to radiation from the package 3 side to the support member 4 by reflecting the heat radiated from the package 3 side using the base side reflecting portion 33. In addition, even if the base side reflecting portion 33 is not disposed on the top surface of the base 31 and is disposed between the support member 4 and the base 31 (for example, on the bottom surface of the support member 4), it is possible to suppress the transfer of heat, which is radiated from the support member 4, to the base 31.

Similar to the heating side reflecting portion 6, the effect described above increases as the reflectance of heat of the base side reflecting portion 33 increases. Accordingly, the reflectance of heat of the base side reflecting portion 33 is preferably 75% or more, more preferably 90% or more, and most preferably 95% or more.

As a constituent material of the base side reflecting portion 33, the same material as the heating side reflecting portion 6 described above can be used.

The base side reflecting portion 33 has a film shape, and the method of forming the base side reflecting portion 33 is not particularly limited. For example, it is possible to use a vapor deposition method, such as deposition and sputtering.

In addition, the base side reflecting portion 33 may be provided when necessary or omitted.

The lid 32 is bonded to the base 31 in which the base side reflecting portion 33 is provided.

A method of bonding the base 31 and the lid 32 to each other is not particularly limited. For example, brazing, seam welding, energy beam welding (laser welding, electron beam welding, and the like), and the like can be used.

In addition, a bonding member for bonding the base 31 and the lid 32 to each other may be interposed between the base 31 and the lid 32. In FIG. 4, the base side reflecting portion 33 is formed on the entire top surface of the base 31, and the base 31 and the lid 32 are bonded to each other through the base side reflecting portion 33. However, the formation region of the base side reflecting portion 33 may be a part of the top surface of the base 31. In this case, the base side reflecting portion 33 may not be interposed between the base 31 and the lid 32.

A constituent material of the lid 32 is not particularly limited. For example, a resin material, a ceramic material, a metal material, and the like can be used.

In addition, it is preferable that the base 31 and the lid 32 be airtightly bonded to each other. That is, it is preferable that the inside of the package 3 be an airtight space. In this case, the inside of the package 3 can be changed to a decompressed state or an inert gas filled state. As a result, the characteristics of the atomic oscillator 1 can be improved.

In particular, it is preferable that the inside of the package 3 be in a decompressed state. In this case, it is possible to suppress the transfer of heat through the space in the package 3. Therefore, it is possible to suppress thermal interference between the heater 25 and the gas cell 21 through the space in the package 3 or between the connection member 29 and the outside of the package 3. As a result, since the heat from the heater 25 is efficiently transferred to the window portions 212 and 213 through the connection member 29, it is possible to reduce the temperature difference between the two window portions 212 and 213. In addition, the transfer of heat between the unit portion 2 and the outside of the package 3 can be suppressed more effectively.

Support Member

The support member 4 (support portion) is housed in the package 3, and has a function of supporting the unit portion 2 against the base 31 that forms a part of the package 3. That is, the support member 4 supports each part of the unit portion 2 directly or indirectly against the base 31.

In addition, the support member 4 has a function of suppressing the transfer of heat between the unit portion 2 and the outside of the package 3. Therefore, it is possible to suppress heat interference between each part of the unit portion 2 and the outside.

Figure 7A:
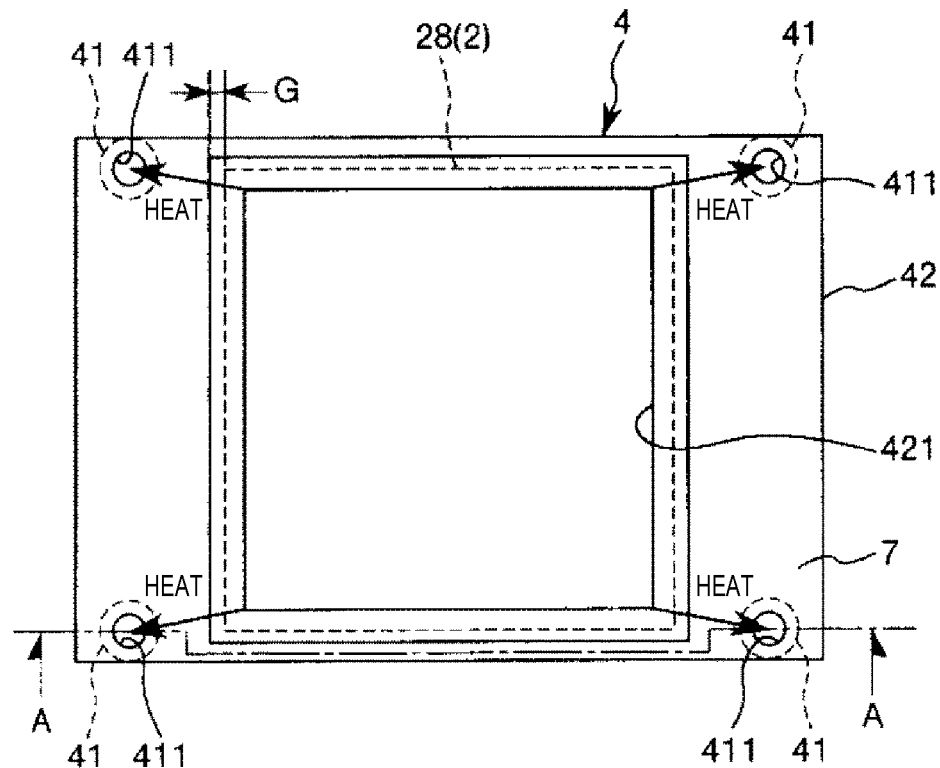
FIG. 7A is a plan view of a support portion of the atomic oscillator shown in FIG. 4.
Figure 7B:
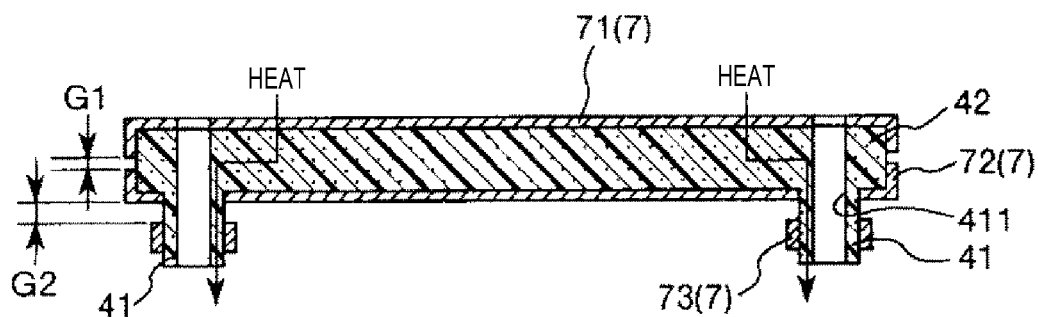
FIG. 7B is a cross-sectional view taken along line A-A of FIG. 7A.

FIG. 7A is a plan view of the support portion of the atomic oscillator shown in FIG. 4, and FIG. 7B is a cross-sectional view taken along the line A-A of FIG. 7A.

As shown in FIGS. 7A and 7B, the support member 4 has a plurality of leg portions 41 (column portions) and a connecting portion 42 that connects the plurality of leg portions 41 to each other.

Each of the plurality of leg portions 41 is bonded to the inner surface of the base 31 in the package 3 by an adhesive, for example.

The plurality of leg portions 41 are disposed outside the unit portion 2 in plan view from a direction in which the base 31 and the unit portion 2 overlap each other (hereinafter, also simply referred to as "in plan view").

In the present embodiment, four leg portions 41 are provided so as to correspond to the corners of the gas cell 21 that forms a square in plan view.

Each leg portion 41 has a cylindrical shape, and is erected so as to extend in a direction perpendicular to the inner surface of the base 31.

A hollow portion 411 is formed in each leg portion 41. Therefore, it is possible to suppress the transfer of heat in each leg portion 41 while ensuring the rigidity of each leg portion 41.

It is preferable that the hollow portion 411 be in an atmosphere decompressed from the atmospheric pressure (decompressed state or vacuum state). In this case, it is possible to suppress the transfer of heat in each leg portion 41 more effectively.

In the present embodiment, the hollow portion 411 extends up and down through the leg portion 41. Therefore, by changing the inside of the package 3 to a decompressed state, the hollow portion 411 can also be changed to the decompressed state.

In addition, when the upper side of the hollow portion 411 is not open, if a gap for making the inside and outside of the hollow portion 411 communicate with each other is formed between each leg portion 41 and the base 31, the hollow portion 411 can also be changed to the decompressed state by changing the inside of the package 3 to the decompressed state.

The connecting portion 42 connects the upper ends (other ends) of the plurality of leg portions 41 to each other. As a result, the rigidity of the support member 4 is increased. In the present embodiment, the connecting portion 42 is formed integrally with the plurality of leg portions 41. The connecting portion 42 may be formed separately from the plurality of leg portions 41 and be bonded to each leg portion 41 by an adhesive, for example.

The entire connecting portion 42 has a plate shape. That is, the connecting portion 42 includes a plate-shaped portion. In this manner, it is possible to increase the rigidity of the support member 4 with a relatively simple structure.

The connecting portion 42 has a rectangular shape so that the four leg portions 41 are located in the corners in plan view.

The unit portion 2 (more specifically, the substrate 28) is bonded (connected) to the top surface (surface on the opposite side to the leg portion 41) of the connecting portion 42. As a result, the unit portion 2 is supported by the support member 4.

A connection portion between the connecting portion 42 and the unit portion 2 is located on the further inner side than the upper ends (other ends) of the plurality of leg portions 41 described above in plan view.

A recess 421 is formed in a central portion of the top surface (that is, a surface facing the unit portion 2) of the connecting portion 42.

A space in the recess 421 is located between the unit portion 2 and the connecting portion 42. Therefore, a space is formed between the connecting portion 42 and the unit portion 2. In this case, since the contact area of the unit portion 2 and the connecting portion 42 is reduced, it is possible to effectively suppress the transfer of heat between the connecting portion 42 and the unit portion 2. In addition, it is also possible to suppress the transfer of heat in the connecting portion 42 by increasing the thermal resistance of the connecting portion 42 by reducing the thickness with the recess 421.

In the present embodiment, the recess 421 is disposed on the inner side rather than the outer shape of the unit portion 2 in plan view. Accordingly, the unit portion 2 is bonded to a portion of the connecting portion 42 on the outer peripheral side rather than the recess 421. The recess 421 may have a portion located outside the outer shape of the unit portion 2 in plan view.

It is preferable that the recess 421 be in a decompressed state. In this case, since the thermal insulation of the recess 421 is increased, it is possible to suppress the escape of heat from the unit portion 2 to the connecting portion 42.

Although the connection portion between the unit portion 2 and the support member 4 may be formed on the entire circumference along the outer periphery of the recess 421, it is preferable to form a plurality of connection portions in a spot shape in terms of suppressing thermal conduction between the unit portion 2 and the support member 4 through the connection portion.

In addition, it is preferable that a gap for making the inside and outside of the recess 421 communicate with each other be formed between the unit portion 2 and the support member 4. Therefore, by changing the inside of the package 3 to a decompressed state, the recess 421 can also be changed to the decompressed state.

According to the support member 4, the lower end (one end) of each leg portion 41 is spaced apart from the unit portion 2 in plan view. Therefore, the support member 4 has a portion (bent portion) in which a heat transfer path from a connection portion between the unit portion 2 and the support member 4 to the lower end of each leg portion 41 (that is, a connection portion between the leg 41 and the base 31) is bent (or curved).

In this case, even if the distance between the base 31 and the unit portion 2 is reduced, it is possible to increase the heat transfer path from the unit portion 2 to the base 31 through the support member 4. As a result, it is possible to suppress the transfer of heat from the unit portion 2 to the base 31 through the support member 4 while miniaturizing the atomic oscillator 1. In addition, since a plurality of leg portions 41 are connected to each other by the connecting portion 42, it is possible to increase the rigidity of the support member 4. Therefore, it is possible to suppress the vibration of the unit portion 2.

It is preferable that the support member 4 be formed of a porous material. In this case, it is possible to increase the thermal insulation (thermal resistance) of the support member 4. Therefore, it is possible to suppress the escape of heat to the base 31 by heat conduction through the support member 4 from the gas cell 21 or the heater 25. As a result, it is possible to reduce the power consumption of the atomic oscillator 1.

The porous material that forms the support member 4 preferably has continuous pores (continuous cells) open to the outer surface of the support member 4. In general, the porous material having continuous pores has a large porosity. For this reason, by forming the support member 4 with a porous material having continuous pores, it is possible to increase the thermal insulation of the support member 4. When the unit portion 2 and the support member 4 are housed in the package 3 in a vacuum state (state decompressed from the atmospheric pressure), the inside of the continuous pores of the porous material can also be made to have a vacuum state. Therefore, it is possible to efficiently increase the thermal insulation of the support member 4. In addition, it is also possible to prevent a situation where pores are crushed under the vacuum state and the porous material is deformed.

In this case, the porous material that forms the support member 4 is preferably foam. Thus, a porous material having a large porosity can be realized relatively easily and reliably.

In addition, a constituent material of the support member 4 is not particularly limited as long as the material has relatively low thermal conductivity and makes it possible for the support member 4 to have rigidity for supporting the unit portion 2. For example, it is preferable to use non-metal materials, such as a resin material and a ceramic material. More preferably, a resin material is used. When the support member 4 is mainly formed of a resin material, it is possible to increase the thermal resistance of the support member 4. In addition, even if the shape of the support member 4 is complicated, the support member 4 can be easily manufactured using a known method, such as injection molding. In particular, when the support member 4 is mainly formed of a resin material, it is possible to easily form the support member 4 that is formed of foam. The constituent material of the leg portion 41 and the constituent material of the connecting portion 42 may be the same or may be different. When the support member 4 is formed of a resin material, an inorganic filler, various additives, and the like may be contained with a content less than 50 wt % in addition to the resin material.

A resin material used as the constituent material of the support member 4 is not particularly limited. For example, polyolefin such as polyethylene and ethylene-vinyl acetate copolymer (EVA), a polyimide-based resin, an acryl-based resin, acrylonitrile-butadiene-styrene copolymer (ABS resin), acrylonitrile-styrene copolymer (AS resin), polyethylene terephthalate (PET), polyether, polyether ketone (PEK), polyether ether ketone (PEEK), various kinds of thermoplastic elastomers including a styrene-based elastomer, a polyolefin-based elastomer, a polyvinyl chloride-based elastomer, a polyurethane-based elastomer, a polyester-based elastomer, a polyamide-based elastomer, a polybutadiene-based elastomer, a trans-polyisoprene-based elastomer, a fluororubber-based elastomer, and a chlorinated polyethylene-based elastomer, an epoxy resin, a phenol resin, a urea resin, a melamine resin, unsaturated polyester, a silicone resin, polyurethane, and copolymers, blends, and polymer alloys, which are mainly composed of the above materials, can be used. In addition, one or two more of these can be used in combination (for example, as a laminate of two or more layers).

Among these resins, it is preferable to use the polyimide-based resin and the acryl-based resin as resin materials used as the constituent material of the support member 4. In this case, it is possible to easily form the support member 4 that is formed of foam. In addition, it is possible to relatively increase the mechanical strength of the support member 4. Since the polyimide resin and the acrylic resin have relatively high chemical stability, it is possible to suppress temporal deterioration of the support member 4.

In addition, it is preferable that the thermal conductivity of the support member 4 be equal to or greater than $0.1\ \text{W}\cdot\text{m}^{-1}\cdot\text{K}^{-1}$ and equal to or less than $40\ \text{W}\cdot\text{m}^{-1}\cdot\text{K}^{-1}$. More preferably, the thermal conductivity of the support member 4 is equal to or greater than $0.1\ \text{W}\cdot\text{m}^{-1}\cdot\text{K}^{-1}$ and equal to or less than $0.5\ \text{W}\cdot\text{m}^{-1}\cdot\text{K}^{-1}$. Thus, thermal conduction between the unit portion 2 and the package 3 through the support member 4 can be suppressed more effectively. That is, it is possible to make the effect of thermally separating the unit portion 2 from the package 3 noticeable by increasing the thermal insulation of the support member 4.

Support Side Reflecting Portion

As shown in FIG. 7B, the support side reflecting portion 7 is disposed on the outer surface of the support member 4, and the reflectance of the support side reflecting portion 7 with respect to an electromagnetic wave having a wavelength of 4 µm is 50% or more. Thus, it is possible to suppress the heat radiated from the support member 4.

In particular, as shown in FIG. 7B, the support side reflecting portion 7 includes a plurality of portions 71, 72, and 73 that are disposed so as to be spaced apart from each other along the vertical direction (that is, a direction in which the gas cell 21 and the base 31 are aligned on the surface of the support member 4). In this case, it is possible to suppress the transfer of heat between the gas cell 21 and the base 31 through the support side reflecting portion 7. In this case, the support side reflecting portion 7 can suppress heat radiation from the support member 4 while reducing an increase in heat conduction between the gas cell 21 and the base 31. As a result, it is possible to reduce the power consumption of the atomic oscillator 1.

In addition, it is also possible to suppress heat transfer due to radiation from the package 3 to the support member 4 by reflecting the heat radiated from the package 3 using the support side reflecting portion 7.

In the present embodiment, a plurality of portions 71, 72, and 73 of the support side reflecting portion 7 are disposed in stripes when viewed from a direction perpendicular to the direction in which the gas cell 21 and the base 31 are aligned. In this manner, it is possible to efficiently suppress heat conduction between the gas cell 21 and the base through the support side reflecting portion 7 with a relatively simple configuration.

The portions 71, 72, and 73 of the support side reflecting portion 7 are aligned in this order from the gas cell 21 side to the base 31 side. The portions 71 and 72 are disposed on the surface of the connecting portion 42 of the support member 4, and the portion 73 is disposed on the surface of the leg portion 41 of the support member 4.

The portion 71 disposed closest to the gas cell 21 is provided not only on the outer peripheral surface of the connecting portion 42 but also on the top surface of the connecting portion 42. Therefore, it is possible to suppress the radiation of heat from the top surface of the connecting portion 42.

The portion 71 is formed in a portion excluding the vicinity of a portion in contact with the unit portion 2, of the top surface of the connecting portion 42 described above, and is spaced apart from the unit portion 2 (specifically, the substrate 28) with a gap G therebetween (refer to FIG. 7A). In this case, it is possible to suppress heat conduction from the unit portion 2 to the support side reflecting portion 7.

The portion 72 is provided not only on the outer peripheral surface of the connecting portion 42 but also on the bottom surface of the connecting portion 42. Therefore, it is possible to suppress the radiation of heat from the bottom surface of the connecting portion 42.

In addition, the portion 72 is spaced apart from the portion 71 with a gap G1 therebetween, and is spaced apart from the portion 73 with a gap G2 therebetween. In this case, it is possible to suppress heat conduction between each of the portions 71 and 73 and the portion 72. Here, the gaps G1 and G2 are disposed so as to cross (cut off) the heat transfer path of the heat from the gas cell 21 side of the support side reflecting portion 7 to the base 31 side. In other words, the portions 71, 72, and 73 are disposed so as to be interrupted intermittently by the gaps G1 and G2 on the way from the gas cell 21 side to the base 31 side. Therefore, it is possible to suppress heat conduction from the gas cell 21 side of the support side reflecting portion 7 to the base 31 side.

The effect described above increases as the reflectance (reflectance of heat) of the support side reflecting portion 7 with respect to an electromagnetic wave having a wavelength of 4 µm increases. Accordingly, the reflectance of the support side reflecting portion 7 is preferably 75% or more, more preferably 90% or more, and most preferably 95% or more.

A constituent material of the support side reflecting portion 7 is not particularly limited as long as the reflectance of heat of the material is higher than that of the outer surface of the support member 4, and it is preferable to use a metal material. In this manner, it is possible to set the reflectance of heat of the support side reflecting portion 7 to 75% or more. As a result, the effect of suppressing the radiation of heat from the support side reflecting portion 7 can be appropriately achieved.

A metal material that forms the support side reflecting portion 7 is not particularly limited. For example, it is possible to use metals, such as copper (reflectance of heat of 97.93%), silver (reflectance of heat of 98.47%), gold (reflectance of heat of 98.62%), titanium (reflectance of heat of 78.04%), chromium (reflectance of heat of 93.77%), iron (reflectance of heat of 87.09%), cobalt (reflectance of heat of 87.75%), nickel (reflectance of heat of 92.38%), aluminum (reflectance of heat of 99.03%), iridium (reflectance of heat of 98.73%), and lead (reflectance of heat of 98.90%), or an alloy containing at least one of these metals. Among these materials, in terms of high reflectance of heat, it is preferable to use copper, silver, gold, chromium, nickel, aluminum, iridium, and lead. In addition, in terms of excellent chemical stability, gold is preferable.

The support side reflecting portion 7 may be formed of one kind of metal or alloy, or may be formed by laminating two or more kinds of metals or alloys.

Although the materials described above have larger thermal conductivity than that of the material that forms the support member 4, it is possible to suppress the heat conduction of the entire support side reflecting portion 7 by providing the gaps G1 and G2 as described above.

Each of the portions 71, 72, and 73 has a film shape, and the method of forming the support side reflecting portion 7 is not particularly limited. For example, it is possible to use a vapor deposition method, such as deposition and sputtering.

Wiring Line

Figures 9A, 9B:
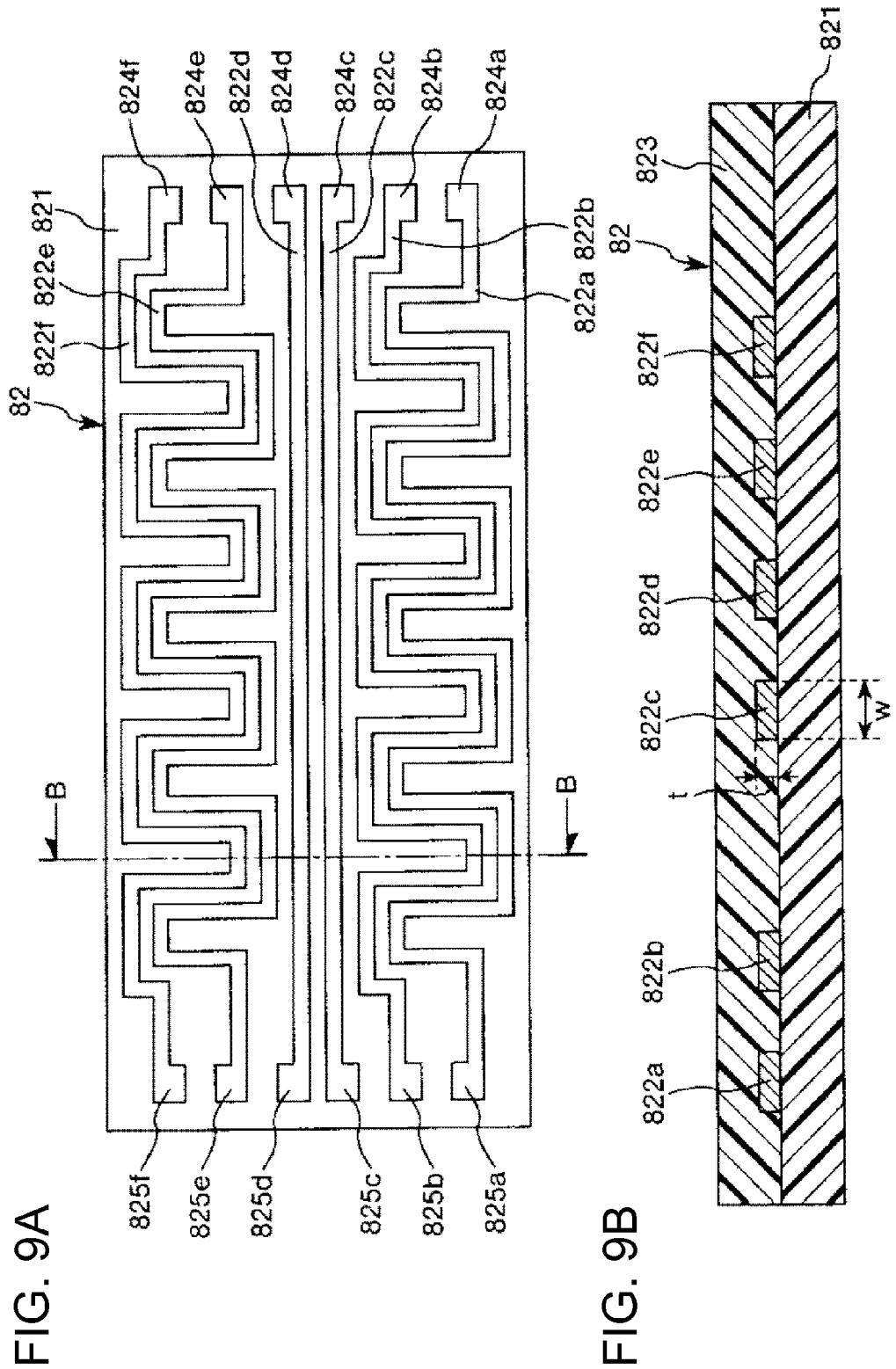
FIG. 9A is a developed view of wiring lines connected to a light emitting portion, a heating portion, and a temperature sensor shown in FIG. 8.
FIG. 9B is a cross-sectional view taken along the line B-B of FIG. 9A.
Figure 10A:
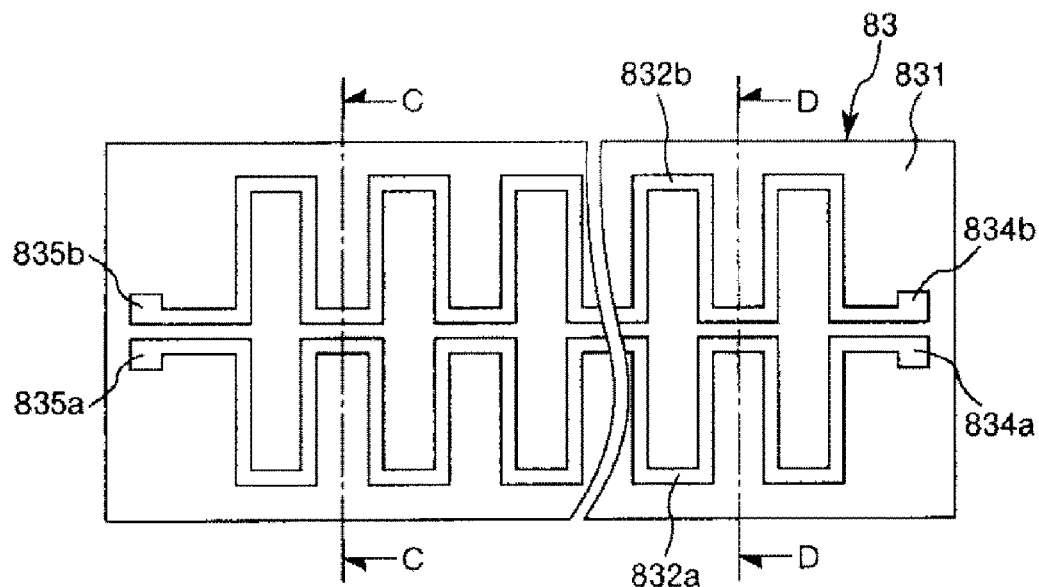
FIG. 10A is a developed view of wiring lines connected to a light detecting portion shown in FIG. 8.

FIG. 8 is a side view for explaining wiring lines provided in the atomic oscillator shown in FIG. 4. FIG. 9A is a developed view of wiring lines connected to the light emitting portion, the heating portion, and the temperature sensor shown in FIG. 8, and FIG. 9B is a cross-sectional view taken along the line B-B of FIG. 9A. FIG. 10A is a developed view of wiring lines connected to the light detecting portion shown in FIG. 8, FIG.

Figure 10B:
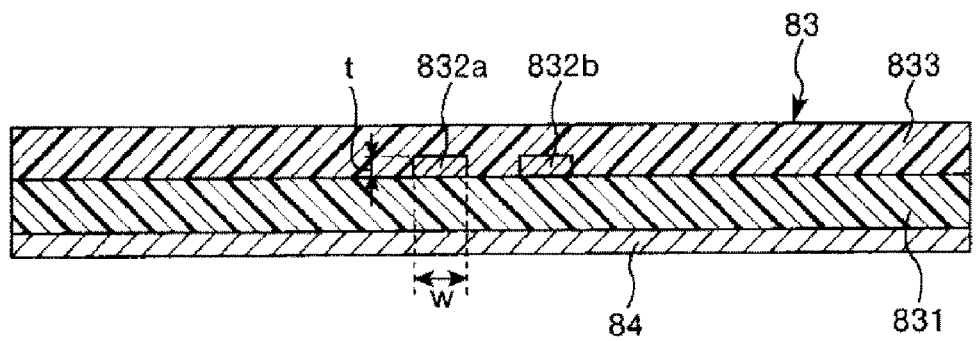
FIG. 10B is a cross-sectional view taken along the line C-C of FIG. 10A.
Figure 10C:
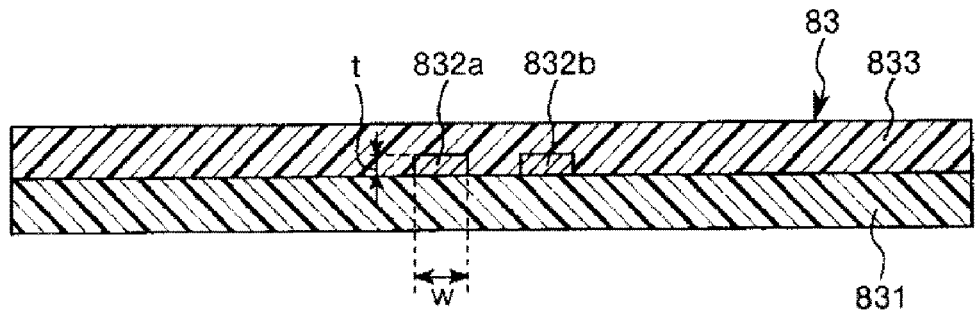
FIG. 10C is a cross-sectional view taken along the line D-D of FIG. 10A.
Figure 11:
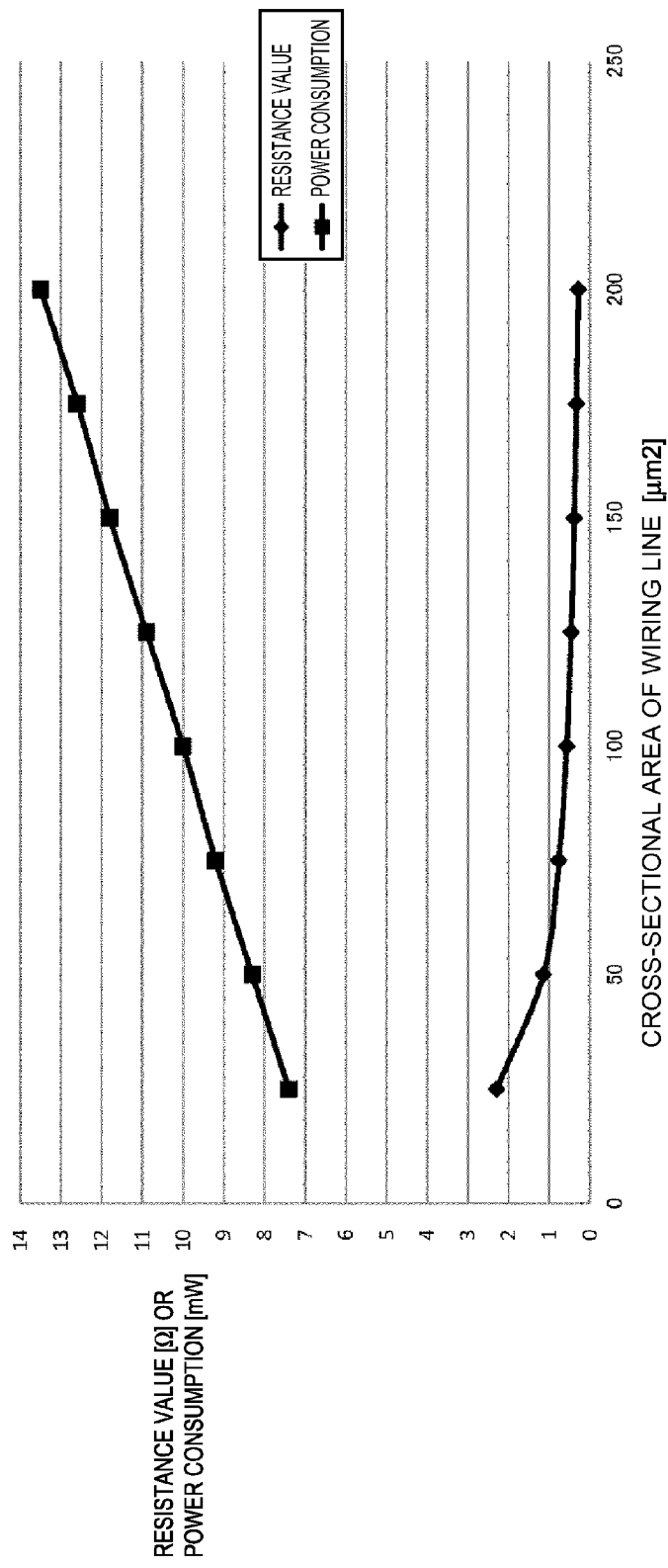
FIG. 11 is a graph showing the relationship between the cross-sectional area of the wiring line connected to the heating portion and the resistance of the wiring line and between the cross-sectional area of the wiring line connected to the heating portion and the power consumption of the heating portion.

10B is a cross-sectional view taken along line C-C of FIG. 10A, and FIG. 10C is a cross-sectional view taken along the line D-D of FIG. 10A. FIG. 11 is a graph showing the relationship between the cross-sectional area of the wiring line connected to the heating portion and the resistance of the wiring line and between the cross-sectional area of the wiring line connected to the heating portion and the power consumption of the heating portion.

As shown in FIG. 8, the wiring portion 82 electrically connects the substrate 28 and the base 31 to each other. In addition, the wiring portion 83 electrically connects the light detecting portion 24 and the base 31 to each other.

Hereinafter, the wiring portions 82 and 83 will be sequentially described in detail.

Each of the wiring portions 82 and 83 is formed of a flexible wiring substrate. Specifically, as shown in FIGS. 9A and 9B, the wiring portion 82 includes a base film 821, a plurality of wiring lines 822a, 822b, 822c, 822d, 822e, and 822f (hereinafter, also referred to as a "wiring line 822"), and a cover film 823. Similarly, as shown in FIGS. 10A to 10C, the wiring portion 83 includes a base film 831, a plurality of wiring lines 832a and 832b (hereinafter, also referred to as a "wiring line 832"), and a cover film 833. An adhesive layer may be provided between the respective layers of the wiring portions 82 and 83.

Each of the base film 821 and the cover film 823 is a sheet-like insulating film, and supports the wiring line 822. Similarly, each of the base film 831 and the cover film 833 is a sheet-like insulating film, and supports the wiring line 832. Therefore, the wiring lines 822 and 832 can be stably provided.

The thickness of the base films 821 and 831 and the cover films 823 and 832 is not particularly limited as long as the wiring line 822 or the wiring line 832 can be supported, and it is preferable that the base films 821 and 831 and the cover films 823 and 832 be as thin as possible in terms of increasing the thermal resistance.

Constituent materials of the base films 821 and 831 and the cover films 823 and 833 are not particularly limited. For example, it is possible to use a resin material, such as polyimide resin.

In addition, it is preferable that at least one of the base film 821 and the cover film 823 be formed of a porous material (foam). In this case, since the thermal insulation of the corresponding film is increased, it is possible to suppress the escape of heat from the substrate 28 to the base 31 by heat conduction through the film. Similarly, it is preferable that at least one of the base film 831 and the cover film 833 be formed of a porous material (foam). In this case, since the thermal insulation of the corresponding film is increased, it is possible to suppress the escape of heat from the light detecting portion 24 to the base 31 by heat conduction through the film.

The wiring line 822 is disposed between the base film 821 and the cover film 823. Similar to the wiring line 822, the wiring line 832 is disposed between the base film 831 and the cover film 833.

The wiring line 822 is configured to include a pair of wiring lines 822a and 822b electrically connected to the temperature sensor 26, a pair of wiring lines 822c and 822d electrically connected to the light emitting portion 22, and a pair of wiring lines 822e and 822f electrically connected to the heater 25.

Terminals 824a, 824b, 824c, 824d, 824e, and 824f electrically connected to the base 31 are respectively provided at one-side ends (ends on the right side in FIG. 9A) of the wiring lines 822a, 822b, 822c, 822d, 822e, and 822f. On the other hand, terminals 825a, 825b, 825c, 825d, 825e, and 825f electrically connected to the substrate 28 are respectively provided at the other ends (ends on the left side in FIG. 9A) of the wiring lines 822a, 822b 822c, 822d, 822e, and 822f.

Meanwhile, the wiring line 832 is configured to include a pair of wiring lines 832a and 832b electrically connected to the light detecting portion 24.

Terminals 834a and 834b electrically connected to the base 31 are respectively provided at one-side ends (ends on the right side in FIG. 10A) of the wiring lines 832a and 832b. On the other hand, terminals 835a and 835b electrically connected to the light detecting portion 24 are respectively provided at the other ends (ends on the left side in FIG. 10A) of the wiring lines 832a and 832b.

Preferably, at least one of the wiring line 822a, 822b, 822c, 822d, 822e, 822f, 832a, and 832b includes a portion having a cross-sectional area of 60 $\mu m^2$ or more and 100 $\mu m^2$ or less. In this manner, it is possible to suppress the escape of heat to the base 31 by heat conduction through the wiring line 822 or 832 from the gas cell 21, the heater 25, or the like while suppressing an increase in the electrical resistance value of the wiring line 822 or 832. As a result, it is possible to reduce the power consumption of the atomic oscillator 1.

In particular, at least the wiring lines 822e and 822f of the wiring lines 822a, 822b, 822c, 822d, 822e, 822f, 832a, and 832b include a portion having a cross-sectional area of 60 $\mu m^2$ or more and 100 $\mu m^2$ or less.

Among the electronic components of the atomic oscillator 1, the heater 25 consumes the largest amount of power of the power consumed by the atomic oscillator 1. As the cross-sectional area of each of the wiring lines 822e and 822f connected to the heater 25 decreases, the power consumption of the heater 25 also decreases, as shown in FIG. 11. In particular, when the cross-sectional area of each of the wiring lines 822e and 822f becomes 100 $\mu m^2$ or less, the power consumption of the heater 25 becomes 10 mW or less. When the power consumption of the heater 25 becomes 10 mW or less, the power consumption of the entire atomic oscillator 1 can be reduced to 100 mW or less. Therefore, the heater 25 can be mounted in various electronic apparatuses.

In addition, as the cross-sectional areas of the wiring lines 822e and 822f decrease, the electrical resistance values of the wiring lines 822e and 822f gradually increase. In other words, as the cross-sectional areas of the wiring lines 822e and 822f decrease, the thermal resistance values of the wiring lines 822e and 822f gradually increase. Therefore, the escape of heat by heat conduction through the wiring lines 822e and 822f can be suppressed by reducing the cross-sectional area of the wiring lines 822e and 822f.

However, when the cross-sectional areas of the wiring lines 822e and 822f become smaller than 60 $\mu m^2$, the thermal resistance values of the wiring lines 822e and 822f abruptly increase. For this reason, the wiring lines 822e and 822f themselves easily generate heat. In addition, since the cross-sectional areas of the wiring lines 822e and 822f are small, the wiring lines 822e and 822f are likely to deteriorate or break. In particular, since the amount of electrical power supplied to the heater 25 is relatively large, heat generated by each of the wiring lines 822e and 822f themselves is a problem. In addition, when the cross-sectional area is smaller than 60 $\mu m^2$, it is difficult to form the wiring lines 822e and 822f.

From the above point of view, the cross-sectional area of the wiring line 822 is optimized by setting the cross-sectional area of each wiring line 822 to 60 $\mu m^2$ or more and 100 $\mu m^2$ or less. Therefore, it is possible to suppress the escape of heat to the base 31 by heat conduction through the wiring line 822 from the gas cell 21 or the heater 25 while suppressing an increase in the electrical resistance value of the wiring line 822. As a result, it is possible to reduce the power consumption of the atomic oscillator 1.

Here, the entire length of the wiring portion 82 is smaller than the entire length of the wiring portion 83. For this reason, the heat transfer path from the unit portion 2 to the base 31 in the case of the wiring portion 82 is shorter than that in the case of the wiring portion 83. Therefore, it is preferable that at least the wiring line 822 of the wiring lines 822 and 832 include a portion in which the cross-sectional area of each wiring line is 60 μm² or more and 100 μm² or less.

The cross-sectional shape of each of the wiring lines 822 and 832 is a rectangle, and the length of each of the wiring lines 822 and 832 in the short side direction is preferably 0.5 μm or more and 5 μm or less, and more preferably 1 μm or more and 4 μm or less. In this case, it is possible to easily form the wiring lines 822 and 832 having small cross-sectional areas. In addition, it is possible to prevent breakage due to bending of the wiring lines 822 and 832. In contrast, if the length in the short side direction is too small, the thickness of the wiring lines 822 and 832 is too thin. Accordingly, breakage due to bending of the wiring lines 822 and 832 is likely to occur. On the other hand, if the length in the short side direction is too large, the aspect ratio of the wiring lines 822 and 832 is too large when realizing the cross-sectional area described above. Accordingly, it becomes difficult to form the wiring lines 822 and 832.

In addition, wiring lines excluding the wiring lines 822c and 822d connected to the light emitting portion 22, that is, the wiring lines 822a, 822b, 822e, 822f, 832a, and 832b include meandering wiring lines. In this case, the thermal resistance of the wiring lines 822a, 822b, 822e, 822f, 832a, and 832b can be increased by increasing the heat transfer path of the wiring lines 822a, 822b, 822e, 822f, 832a, and 832b. As a result, it is possible to effectively suppress the escape of heat to the base 31 by heat conduction through the wiring lines 822a, 822b, 822e, 822f, 832a, and 832b from the gas cell 21 or the heater 25.

In particular, since the wiring lines 822e and 822f electrically connected to the heater 25 include meandering wiring lines, it is possible to effectively suppress the escape of heat to the base 31 by heat conduction through the wiring lines 822e and 822f from the heater 25.

On the other hand, the wiring lines 822c and 822d are linearly formed. Therefore, a current including a high frequency can be efficiently supplied to the light emitting portion 22.

A constituent material of each of the wiring lines 822 and 832 is not particularly limited, and it is preferable to use a metal material. Generally, a metal material has excellent ductility. Therefore, it is possible to easily form the wiring lines 822 and 832 having small cross-sectional areas by forming the wiring lines 822 and 832 using a metal material.

As such a metal material, it is preferable to use platinum or an alloy containing platinum or copper or an alloy containing copper.

Platinum or the alloy containing platinum and copper or the alloy containing copper have relatively low thermal conductivity as well as allowing a thin film to be easily formed. In this manner, it is possible to reduce the thermal conductivity of the wiring lines 822 and 832. In addition, since platinum or the alloy containing platinum has excellent chemical stability, it is not necessary to coat the wiring lines 822 and 832 in order to prevent corrosion and the like. Therefore, the wiring lines 822 and 832 can be easily formed, and the cross-sectional areas of the wiring lines 822 and 832 can be easily reduced. In addition, it is possible to prevent breakage due to bending of the wiring lines 822 and 832.

The connection between the wiring portion 82 and the substrate 28 and the base 31 and the connection between the wiring portion 83 and the light detecting portion 24 and the base 31 are not particularly limited. For example, the connections can be performed using an anisotropic conductive film (ACF), anisotropic conductive paste (ACP), or the like.

Although the wiring portion 82 is formed separately from the substrate 28 in the present embodiment, the wiring portion 82 and the substrate 28 may be integrally formed. In this case, for example, both the wiring portion 82 and the substrate 28 may be integrally formed using a flexible wiring substrate, or may be formed using a rigid flexible wiring substrate in which the wiring portion 82 is a flexible portion and the substrate 28 is a rigid portion.

As shown in FIG. 8, a reflecting portion 84 is provided on the outer surface of the wiring portion 83 of the wiring portions 82 and 83 described above.

As shown in FIG. 10B, the reflecting portion 84 is disposed on the surface of the base film 831 of the wiring portion 83. The reflectance of the reflecting portion 84 with respect to an electromagnetic wave having a wavelength of 4 μm is 50% or more. Thus, it is possible to suppress the radiation of heat from the base film 831.

The reflecting portion 84 is disposed on the unit portion 2 side (upper side in FIG. 8) of the base film 831. Therefore, it is possible to efficiently suppress the radiation of heat from the base film 831 while suppressing heat conduction to the base 31 by heat conduction through the reflecting portion 84 from the unit portion 2.

Similar to the heating side reflecting portion 6 described above, the effect described above increases as the reflectance of heat of the reflecting portion 84 increases. Accordingly, the reflectance of heat of the reflecting portion 84 is preferably 75% or more, more preferably 90% or more, and most preferably 95% or more.

As a constituent material of the reflecting portion 84, the same material as the heating side reflecting portion 6 described above can be used.

The reflecting portion 84 has a film shape, and the method of forming the reflecting portion 84 is not particularly limited. For example, it is possible to use a vapor deposition method, such as deposition and sputtering. In addition, the reflecting portion 84 may be provided when necessary or omitted.

Control Unit

The control unit 5 shown in FIG. 1 has a function of controlling the heater 25, the coil 27, and the light emitting portion 22.

The control unit 5 includes an excitation light control portion 51 that controls the frequencies of the resonance light components 1 and 2 of the light emitting portion 22, a temperature control portion 52 that controls the temperature of the alkali metal in the gas cell 21, and a magnetic field control portion 53 that controls a magnetic field applied to the gas cell 21.

The excitation light control portion 51 controls the frequencies of the resonance light components 1 and 2 emitted from the light emitting portion 22 based on a detection result of the light detecting portion 24 described above. More specifically, the excitation light control portion 51 controls the frequencies of the resonance light components 1 and 2 emitted from the light emitting portion 22 such that ($\omega_2 - \omega_2$) detected by the light detecting portion 24 described above becomes the above-described frequency $\omega_0$ unique to the alkali metal. In addition, the excitation light control portion 51 controls the center frequency of the resonance light components 1 and 2 emitted from the light emitting portion 22. Thus, it is possible to detect the EIT signal described above.

In addition, the control unit 5 causes a signal of a crystal oscillator (not shown) to be output in synchronization with the EIT signal.

The temperature control portion 52 controls the application of current to the heater 25 based on the detection result of the temperature sensor 26. Thus, the gas cell 21 can be maintained in a desired temperature range.

In addition, the magnetic field control portion 53 controls the application of current to the coil 27 such that the magnetic field generated by the coil 27 is constant.

The control unit 5 is provided, for example, in an IC chip mounted on a substrate on which the package 3 is mounted. In addition, the control unit 5 may also be provided in the package 3 (for example, on the base 31).

As described above, according to the atomic oscillator 1 of the present embodiment, the cross-sectional areas of the wiring lines 822 and 832 are optimized. Therefore, it is possible to suppress the escape of heat to the base 31 by heat conduction through the wiring lines 822 and 832 from the gas cell 21 or the heater 25 while suppressing an increase in the electrical resistance values of the wiring lines 822 and 832. As a result, it is possible to reduce power consumption of the atomic oscillator 1.

2. Electronic Apparatus

The atomic oscillator according to the invention described above can be assembled into various kinds of electronic apparatuses. Such an electronic apparatus including the atomic oscillator according to the invention has excellent reliability.

Hereinafter, an example of the electronic apparatus including the atomic oscillator according to the invention will be described.

Figure 12:
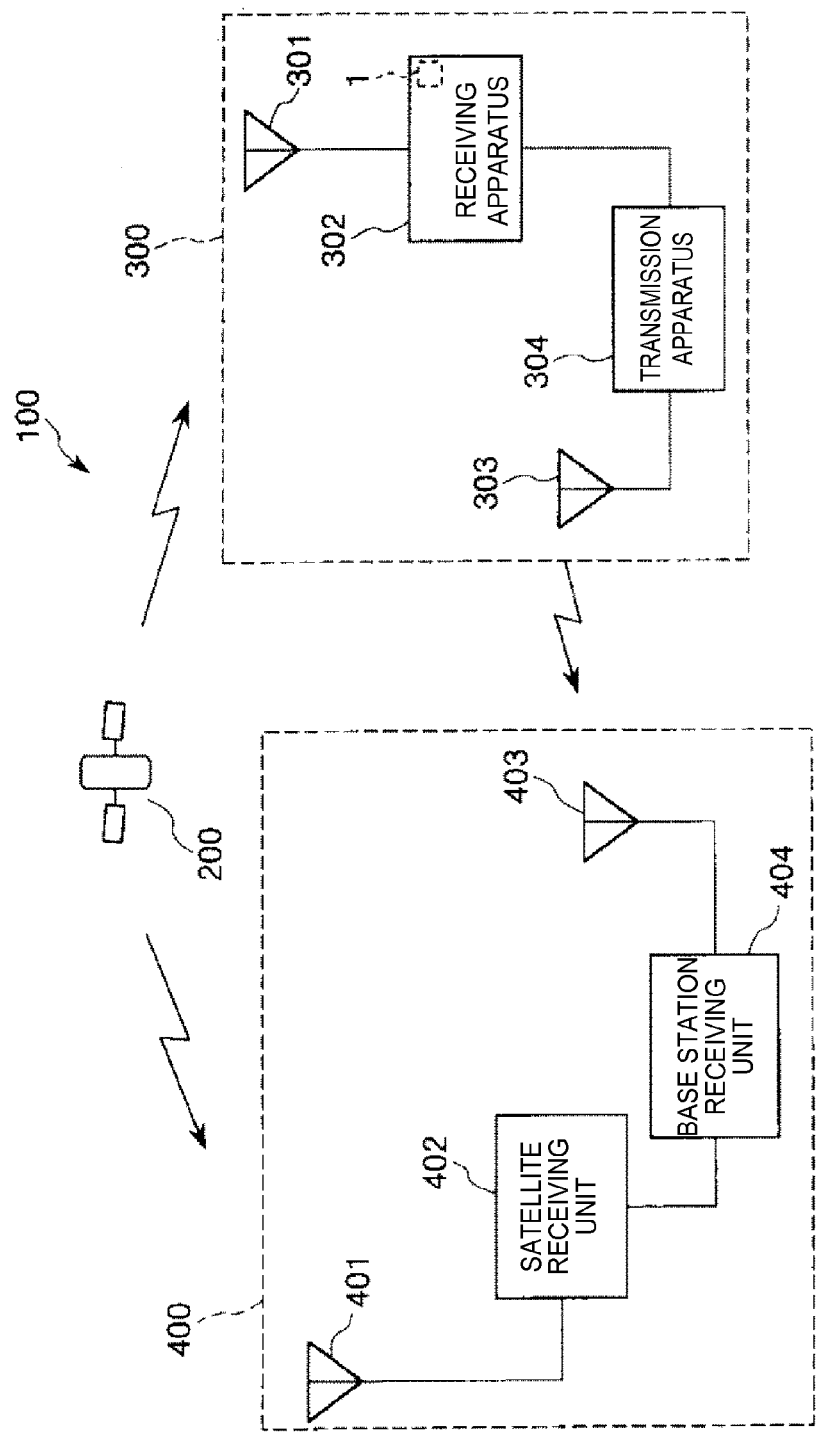
FIG. 12 is a diagram showing the schematic configuration when the atomic oscillator according to the embodiment of the invention is used in a positioning system using a GPS satellite.

FIG. 12 is a diagram showing the schematic configuration when the atomic oscillator according to the invention is used in a positioning system using a GPS satellite.

A positioning system 100 shown in FIG. 12 is configured to include a GPS satellite 200, a base station apparatus 300, and a GPS receiver 400.

The GPS satellite 200 transmits positioning information (GPS signal).

The base station apparatus 300 includes a receiving apparatus 302 that receives positioning information from the GPS satellite 200 with high accuracy through an antenna 301 disposed in the electronic reference point (GPS continuous observation station), for example, and a transmission apparatus 304 that transmits the positioning information received by the receiving apparatus 302 through an antenna 303.

Here, the receiving apparatus 302 is an electronic apparatus including the above-described atomic oscillator 1 according to the invention as a reference frequency oscillation source. Such a receiving apparatus 302 has excellent reliability. In addition, the positioning information received by the receiving apparatus 302 is transmitted by the transmission apparatus 304 in real time.

The GPS receiver 400 includes a satellite receiving unit 402 that receives the positioning information from the GPS satellite 200 through an antenna 401 and a base station receiving unit 404 that receives the positioning information from the base station apparatus 300 through an antenna 403.

3. Moving Object

In addition, the atomic oscillator according to the invention described above can be assembled into various kinds of moving objects. Such a moving object including the atomic oscillator according to the invention has excellent reliability.

Hereinafter, an example of the moving object according to the invention will be described.

Figure 13:
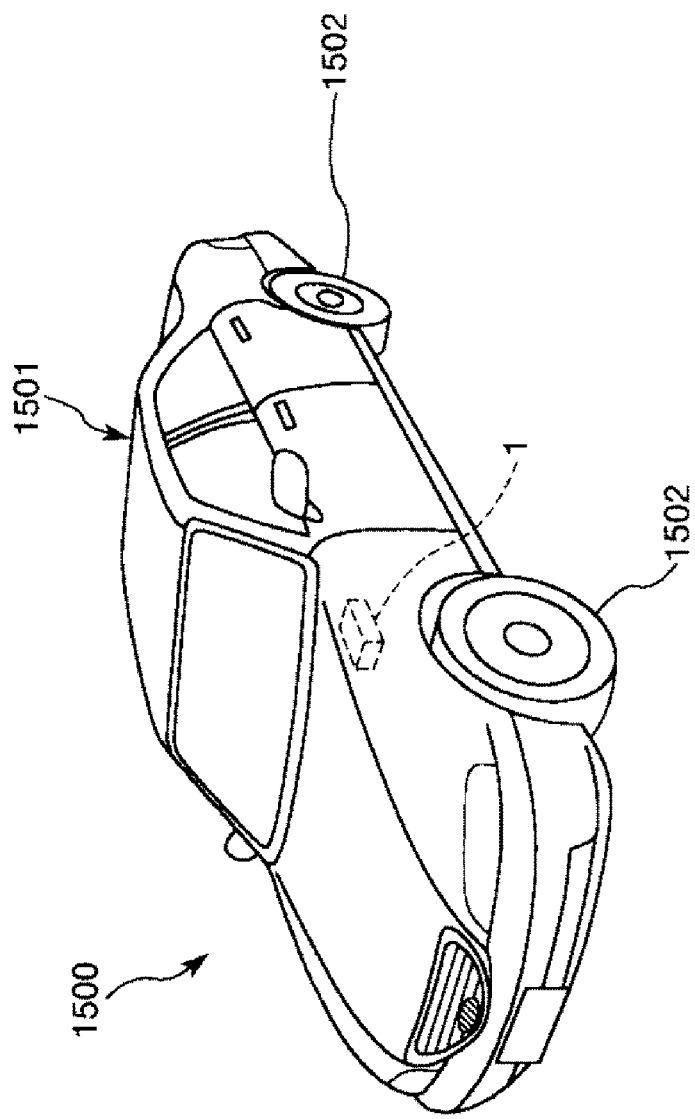
FIG. 13 is a perspective view showing the configuration of a moving object (vehicle) including the atomic oscillator according to the embodiment of the invention.

FIG. 13 is a perspective view showing the configuration of a moving object (vehicle) including the atomic oscillator according to the invention.

A moving object 1500 shown in FIG. 13 includes a vehicle body 1501 and four wheels 1502, and is configured to rotate the wheels 1502 using a power source (engine; not shown) provided in the vehicle body 1501. The atomic oscillator 1 is built into the moving object 1500. Based on the oscillation signal from the atomic oscillator 1, for example, a control unit (not shown) controls the driving of the power source.

In addition, electronic apparatuses or moving objects including the atomic oscillator or the quantum interference device according to the invention are not limited to those described above. For example, the atomic oscillator or the quantum interference device according to the invention can also be applied to a mobile phone, a digital still camera, an ink jet type discharge apparatus (for example, an ink jet printer), a personal computer (a mobile personal computer and a laptop personal computer), a television, a video camera, a video tape recorder, a car navigation apparatus, a pager, an electronic diary (electronic diary with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for vehicles, aircraft, and ships), a flight simulator, a terrestrial digital broadcasting, and a mobile phone base station.

While the quantum interference device, the atomic oscillator, the electronic apparatus, and the moving object according to the invention have been described with reference to the illustrated embodiments, the invention is not limited to these. For example, the configuration of each portion of the embodiments described above may be replaced with an arbitrary configuration having the same function, and an arbitrary configuration may be added.

In the above embodiment, the case where the support portion is configured to include a plurality of leg portions and a connecting portion has been described as an example. However, the shape of the support portion is not limited to this as long as the shape can support the unit portion including a gas cell and a heating portion against the base portion. For example, the shape of the support portion may be a plate shape, a block shape, or a beam shape. In this case, it is preferable to increase the height or length of the support portion in terms of increasing the heat transfer path between the unit portion and the base portion through the support portion, and it is preferable to reduce the width of the support portion in terms of increasing the thermal resistance of the support portion. The support portion may be formed by a plurality of members.

In the above embodiment, the case where the unit portion supported by the support portion includes a connection member, a substrate, and the like as well as a gas cell has been described as an example. However, the invention is not limited to this, and the unit portion may include at least a gas cell and a heating portion.

In the above embodiment, the case where the gas cell is indirectly supported by the support portion through the substrate and the connection member has been described as an example. However, the gas cell may be directly supported by the support portion.

In the above embodiment, the case of using the flexible wiring substrate for electrical connection between the unit portion and the base portion has been described as an example. However, for example, a lead wire may be used without being limited to the above as long as a portion having the cross-sectional area described above is included.

The entire disclosure of Japanese Patent Application No. 2013-215070, filed Oct. 15, 2013 is expressly incorporated by reference herein.

What is claimed is:

1. A quantum interference device, comprising:
a base portion;
a unit portion including a gas cell, in which metal atoms are filled, and a temperature adjusting portion that adjusts a temperature of the gas cell; and
a wiring line that electrically connects the base portion and the unit portion to each other and includes a portion having a cross-sectional area of 60 $\mu m^2$ or more and 100 $\mu m^2$ or less; and
a reflecting portion that is disposed on a surface of the wiring line, the reflecting portion at least being provided on the wiring line at a location the overlaps the unit portion in plan view.

2. The quantum interference device according to claim 1, wherein the wiring line is supported by an insulating film.

3. The quantum interference device according to claim 1, wherein the reflecting portion has a reflectance with respect to an electromagnetic wave having a wavelength of 4 $\mu m$ that is 50% or more.

4. The quantum interference device according to claim 1, wherein the wiring line contains platinum.

5. The quantum interference device according to claim 1, wherein the wiring line contains copper.

6. The quantum interference device according to claim 1, wherein a cross-sectional shape of the wiring line is a rectangle, and a length of the wiring line in a short side direction is within a range of 0.5 $\mu m$ or more and 5 $\mu m$ or less.

7. The quantum interference device according to claim 1, wherein the wiring line includes a plurality of wirings including a liner wiring and a meandering wiring, the linear wiring configured to conduct a current having a high frequency.

8. An atomic oscillator, comprising:
the quantum interference device according to claim 1.

9. An electronic apparatus, comprising:
the quantum interference device according to claim 1.

10. A moving object, comprising:
the quantum interference device according to claim 1.

* * * * *